US012581733B2

(12) United States Patent
Takechi et al.

(10) Patent No.: US 12,581,733 B2
(45) Date of Patent: Mar. 17, 2026

(54) THIN-FILM TRANSISTOR DEVICE AND METHOD OF MANUFACTURING THE SAME

(71) Applicant: XIAMEN TIANMA DISPLAY TECHNOLOGY CO., LTD., Xiamen (CN)

(72) Inventors: Kazushige Takechi, Kanagawa (JP); Genshiro Kawachi, Kanagawa (JP)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 388 days.

(21) Appl. No.: 18/310,809

(22) Filed: May 2, 2023

(65) Prior Publication Data

US 2023/0369343 A1      Nov. 16, 2023

(30) Foreign Application Priority Data

May 10, 2022      (JP) ................................. 2022-077707

(51) Int. Cl.
  *H10D 86/40*       (2025.01)
  *H10D 86/01*       (2025.01)
(52) U.S. Cl.
  CPC ....... *H10D 86/471* (2025.01); *H10D 86/0221* (2025.01); *H10D 86/0231* (2025.01); *H10D 86/423* (2025.01)

(58) Field of Classification Search
  CPC .............. H10D 86/471; H10D 86/423; H10D 86/0221; H10D 86/0231
  See application file for complete search history.

(56) References Cited

U.S. PATENT DOCUMENTS

| | | |
|---|---|---|
| 2013/0285054 A1 | 10/2013 | Moriguchi et al. |
| 2016/0155736 A1 | 6/2016 | Kim et al. |
| 2021/0273331 A1 | 9/2021 | Misaki |
| 2023/0074433 A1* | 3/2023 | Cho ...................... H10D 86/471 |
| 2023/0197738 A1* | 6/2023 | Dai ...................... H10D 86/471 |
| | | 257/59 |

* cited by examiner

*Primary Examiner* — Peter M Albrecht
(74) *Attorney, Agent, or Firm* — NIXON & VANDERHYE

(57) ABSTRACT

A thin-film transistor device is disclosed. A first semiconductor layer includes a first channel region and first source/drain regions sandwiching the first channel region. A second semiconductor layer includes a second channel region and second source/drain regions sandwiching the second channel region. A metal contact region is located in a hole extending through one or more upper insulating layers and one or more lower insulating layers and in contact with one of the first source/drain regions and one of the second source/drain regions. A diameter of the hole at the lowermost layer in the one or more upper insulating layers is larger than a diameter of the hole at the uppermost layer in the one or more lower insulating layers. The metal contact region is made of the same metal material as source/drain lines of the first thin-film transistor and the second thin-film transistor.

11 Claims, 20 Drawing Sheets

LOW-RESISTIVE IGZO
125

351

PHOTORESIST
320

167

352

135

133

129

124

CROSS-SECTIONAL
STRUCTURE

121

123

119

115

111

108

105
LOW-RESISTIVE LTPS

351

167

LOW-RESISTIVE IGZO
125

326

PHOTORESIST
325

352

133

129

124

353

121

123

119

115

111

108

358

105
LOW-RESISTIVE LTPS

351

LOW-RESISTIVE IGZO
125

PHOTORESIST
325

352

353

124

123

108

105
LOW-RESISTIVE LTPS

LOW-RESISTIVE IGZO
125

164

135

151

161

133

129

121

119

115

124

123

111

108

105
LOW-RESISTIVE LTPS

1

THIN-FILM TRANSISTOR DEVICE AND METHOD OF MANUFACTURING THE SAME

CROSS-REFERENCE TO RELATED APPLICATIONS

This non-provisional application claims priority under 35 U.S.C. § 119(a) on Patent Application No. 2022-077707 filed in Japan on May 10, 2022, the entire content of which is hereby incorporated by reference.

BACKGROUND

This disclosure relates to a thin-film transistor device and a method of manufacturing the same.

A technology of incorporating a low-temperature poly-silicon thin-film transistor (LTPS TFT) and an oxide semiconductor TFT into one pixel circuit is practically available for display devices of smart watches and smartphones. This technology is referred to as hybrid TFT display (HTD) technology in this description. The HTD technology incorporates both a low-temperature polysilicon TFT having high mobility and an oxide semiconductor TFT that generates small leakage current in a pixel circuit to achieve higher display quality and lower power consumption.

SUMMARY

An aspect of this disclosure is a thin-film transistor device including: a first thin-film transistor including a first semiconductor layer on a substrate; a second thin-film transistor including a second semiconductor layer on the substrate; one or more upper insulating layers on the substrate; one or more lower insulating layers on the substrate; and a metal contact region in contact with the first semiconductor layer and the second semiconductor layer. The first semiconductor layer and the second semiconductor layer are made of different materials. The first semiconductor layer, the one or more lower insulating layers, the second semiconductor layer, and the one or more upper insulating layers are laid one above another in this order when viewed from the substrate. The first semiconductor layer includes a first channel region and first source/drain regions sandwiching the first channel region. The second semiconductor layer includes a second channel region and second source/drain regions sandwiching the second channel region. The metal contact region is located in a hole extending through the one or more upper insulating layers and the one or more lower insulating layers and in contact with one of the first source/drain regions and one of the second source/drain regions. A diameter of the hole at the lowermost layer in the one or more upper insulating layers is larger than a diameter of the hole at the uppermost layer in the one or more lower insulating layers. The metal contact region is made of the same metal material as source/drain lines of the first thin-film transistor and the second thin-film transistor.

An aspect of this disclosure is a method of manufacturing a thin-film transistor device, including: producing a first semiconductor layer; producing one or more lower insulating layers above the first semiconductor layer; producing a second semiconductor layer of a material different from a material of the first semiconductor layer above the uppermost layer of the one or more lower insulating layers; producing one or more upper insulating layers above the second semiconductor layer; opening a hole extending through the one or more upper insulating layers and the one or more lower insulating layers to expose a part of a source/drain region of the first semiconductor layer and a part of a source/drain region of the second semiconductor layer within the hole; and producing a metal pattern including source/drain lines and a metal contact region to be in contact with a part of the first semiconductor layer and a part of the second semiconductor layer within the hole.

It is to be understood that both the foregoing general description and the following detailed description are exemplary and explanatory and are not restrictive of this disclosure.

EMBODIMENTS

Figure 1:
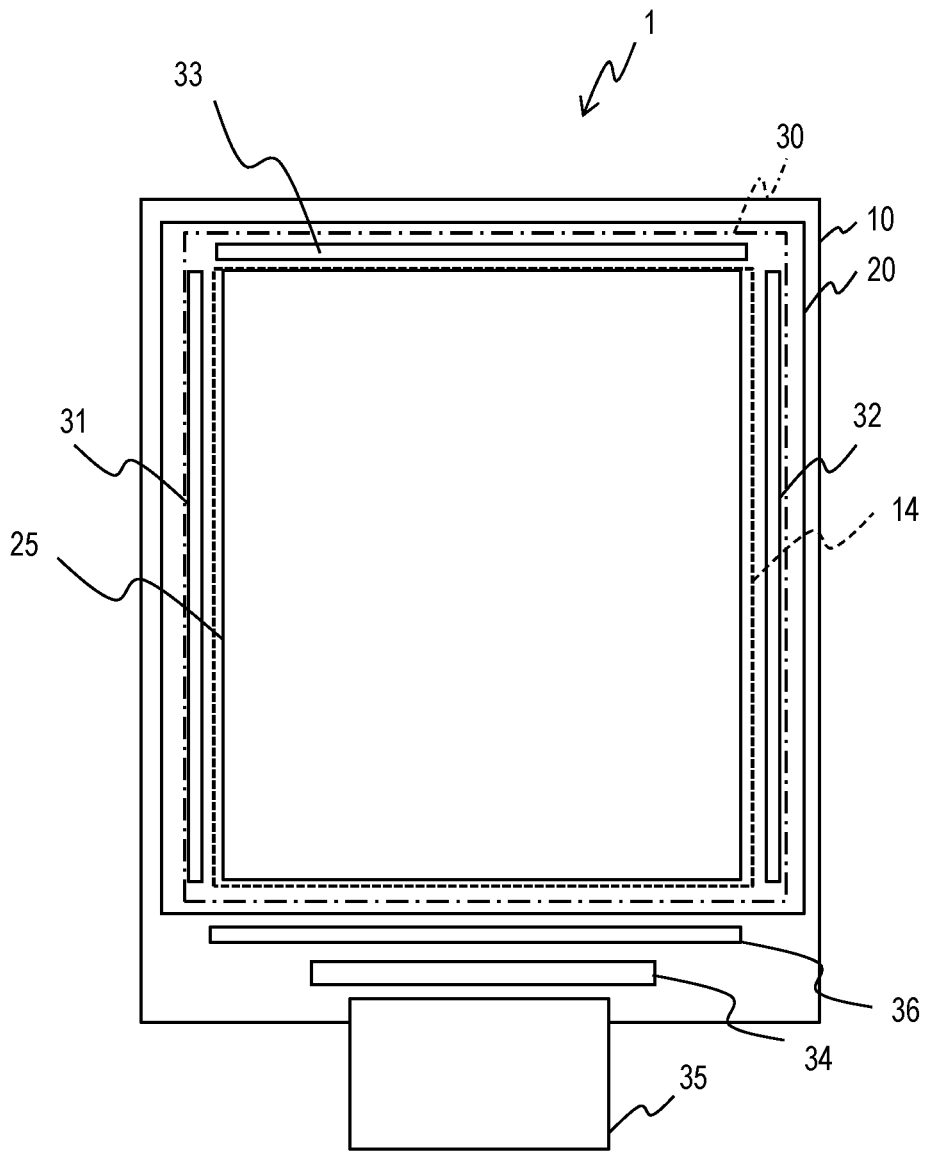
FIG. 1 schematically illustrates a configuration example of an OLED display device.

Hereinafter, embodiments of this disclosure will be described with reference to the accompanying drawings. It should be noted that the embodiments are merely examples to implement this disclosure and are not to limit the technical scope of this disclosure. Elements common to the drawings are denoted by the same reference signs and some elements in the drawings are exaggerated in size or shape for clear understanding of the description.

Overview

The following description employs an organic light-emitting diode (OLED) display device as an example of a thin-film transistor device. The OLED display device in this disclosure includes a low-temperature polysilicon thin-film transistor (LTPS TFT) and an oxide semiconductor TFT in a pixel circuit and/or a peripheral circuit.

The semiconductor layer (low-temperature polysilicon layer) of the low-temperature polysilicon TFT and the semiconductor layer (oxide semiconductor layer) of the oxide semiconductor TFT are located on different levels. For example, the low-temperature polysilicon layer is disposed lower than the oxide semiconductor layer. One or more insulating layers are provided between these semiconductor layers. In this specification, a layer closer to the substrate is referred to as lower layer and a layer farther from the substrate is referred to as upper layer.

The low-temperature polysilicon TFT includes source/drain regions (low-resistive regions) made of polysilicon reduced in resistance (low-resistive polysilicon) and the oxide semiconductor TFT includes source/drain regions (low-resistive regions) made of an oxide semiconductor reduced in resistance (low-resistive oxide semiconductor).

The sheet resistance of the low-resistive source/drain regions is usually within a range from 10Ω to 100 kΩ, for example, a range from several tens ohms to several tens kiloohms. The sheet resistance of the channel not reduced in resistance (highly-resistive) is usually within a range from 1 MΩ to 10 GΩ, for example, a range from several megaohms to several giga ohms.

In an embodiment of this specification, one contact hole interconnects a source/drain line layer, an oxide semiconductor layer, and a low-temperature polysilicon layer. This configuration reduces the number of contact holes to interconnect these three layers, achieving a smaller circuit area.

For example, the source/drain line layer can be the uppermost layer, the low-temperature polysilicon layer can be the lowermost layer, and the oxide semiconductor layer can be located therebetween. One or more insulating layers (one or more upper insulating layers) are provided between the source/drain line layer and the oxide semiconductor layer. Furthermore, one or more insulating layers (one or more lower insulating layers) are provided between the oxide semiconductor layer and the low-temperature polysilicon layer.

The contact hole includes a metal contact region inside a hole extending through the upper insulating layers and the lower insulating layers. The contact region can be made of the same metal as the source/drain lines and included in the same metal layer.

The contact region is provided to stick to the inner surface of the hole. Accordingly, the contact region extends through the upper insulating layers and the lower insulating layers. The contact region is in contact with source/drain regions of the two TFTs exposed in the hole to electrically connect a source/drain line, a source/drain region of the oxide semiconductor layer, and a source/drain region of the low-temperature polysilicon layer.

As described above, interconnecting source/drain regions of two TFTs by one contact hole enables a circuit to have a small area, compared to a configuration using a plurality of contact holes. The contact hole can pass through a source/drain region of the oxide semiconductor layer. Then, the circuit area can be reduced further to contribute to achievement of higher resolution.

The above-described connecting structure is applicable to a circuit in devices different from OLED display devices and also a circuit including TFTs made of semiconductor materials different from an oxide semiconductor and low-temperature polysilicon.

Configuration of Display Device

FIG. 1 schematically illustrates a configuration example of an OLED display device 1. The OLED display device 1 includes a thin-film transistor (TFT) substrate 10 on which organic light-emitting elements (OLED elements) are fabricated, an encapsulation substrate 20 for encapsulating the OLED elements, and a bond (glass frit sealer) 30 for bonding the TFT substrate 10 with the encapsulation substrate 20. The space between the TFT substrate 10 and the encapsulation substrate 20 is filled with dry nitrogen and sealed up with the bond 30. The encapsulation substrate 20 and the bond 30 constitute an example of a structural encapsulation unit. The structural encapsulation unit can have a thin film encapsulation (TFE) structure.

In the periphery of a cathode electrode region 14 outer than the display region 25 of the TFT substrate 10, a scanning driver 31, an emission driver 32, a protection circuit 33, a driver IC 34, and a demultiplexer 36 are provided. The driver IC 34 is connected to external devices via flexible printed circuits (FPC) 35. The scanning driver 31, the emission driver 32, and the protection circuit 33 are peripheral circuits fabricated on the TFT substrate 10.

The scanning driver 31 drives scanning lines on the TFT substrate 10. The emission driver 32 drives emission control lines to control the light emission periods of pixels. The driver IC 34 is mounted with an anisotropic conductive film (ACF), for example.

The protection circuit 33 protects the elements in the pixel circuits from electrostatic discharge. The driver IC 34 provides power and timing signals (control signals) to the scanning driver 31 and the emission driver 32 and further, provides power and a data signal to the demultiplexer 36.

The demultiplexer 36 outputs output of one pin of the driver IC 34 to d data lines in turn (d is an integer more than 1). The demultiplexer 36 changes the output data line for the data signal from the driver IC 34 d times per scanning period to drive d times as many data lines as output pins of the driver IC 34.

Configuration of Pixel Circuit

Figure 2A:
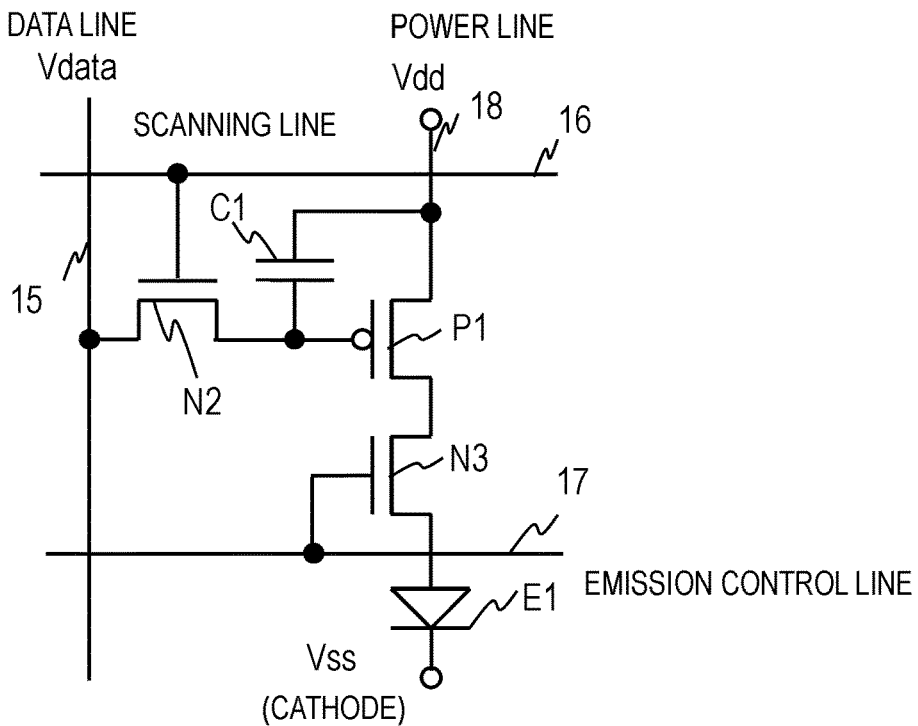
FIG. 2A illustrates a configuration example of a pixel circuit.

A plurality of pixel circuits are fabricated on the TFT substrate 10 to control electric current to be supplied to anode electrodes of subpixels (also simply referred to as pixels). FIG. 2A illustrates a configuration example of a pixel circuit. Each pixel circuit includes a driving transistor P1, a selection transistor N2, an emission transistor N3, and a storage capacitor C1. The pixel circuit controls light emission of an OLED element E1. The OLED element E1 is a light-emitting element and the transistors are TFTs.

The selection transistor N2 is a switch for selecting the subpixel. The selection transistor N2 is an n-channel type of oxide semiconductor TFT and its gate terminal is connected to a scanning line 16. The source terminal is connected to a data line 15. The drain terminal is connected to the gate terminal of the driving transistor P1.

The driving transistor P1 is a transistor (driving TFT) for driving the OLED element E1. The driving transistor P1 is a p-channel type of low-temperature polysilicon TFT and its gate terminal is connected to the drain terminal of the selection transistor N2. The source terminal of the driving transistor P1 is connected to a power line (Vdd) 18. The drain terminal is connected to the source terminal of the emission transistor N3. The storage capacitor C1 is provided between the gate terminal and the source terminal of the driving transistor P1.

The emission transistor N3 is a switch for controlling supply/stop of the driving current to the OLED element E1. The emission transistor N3 is an n-channel type of oxide semiconductor TFT and its gate terminal is connected to an emission control line 17. The source terminal of the emission transistor N3 is connected to the drain terminal of the driving transistor P1. The drain terminal of the emission transistor N3 is connected to the OLED element E1.

Next, operation of the pixel circuit is described. The scanning driver 31 outputs a selection pulse to the scanning line 16 to turn on the selection transistor N2. The data voltage supplied from the driver IC 34 through the data line 15 is stored to the storage capacitor C1. The storage capacitor C1 holds the stored voltage during the period of one frame. The conductance of the driving transistor P1 changes in an analog manner in accordance with the stored voltage, so that the driving transistor P1 supplies a forward bias current corresponding to a light emission level to the OLED element E1.

The emission transistor N3 is located on the supply path of the driving current. The emission driver 32 outputs a control signal to the emission control line 17 to control ON/OFF of the emission transistor N3. When the emission transistor N3 is ON, the driving current is supplied to the OLED element E1. When the emission transistor N3 is OFF, this supply is stopped. The lighting period (duty ratio) in the period of one frame can be controlled by controlling ON/OFF of the transistor N3.

Figure 2B:
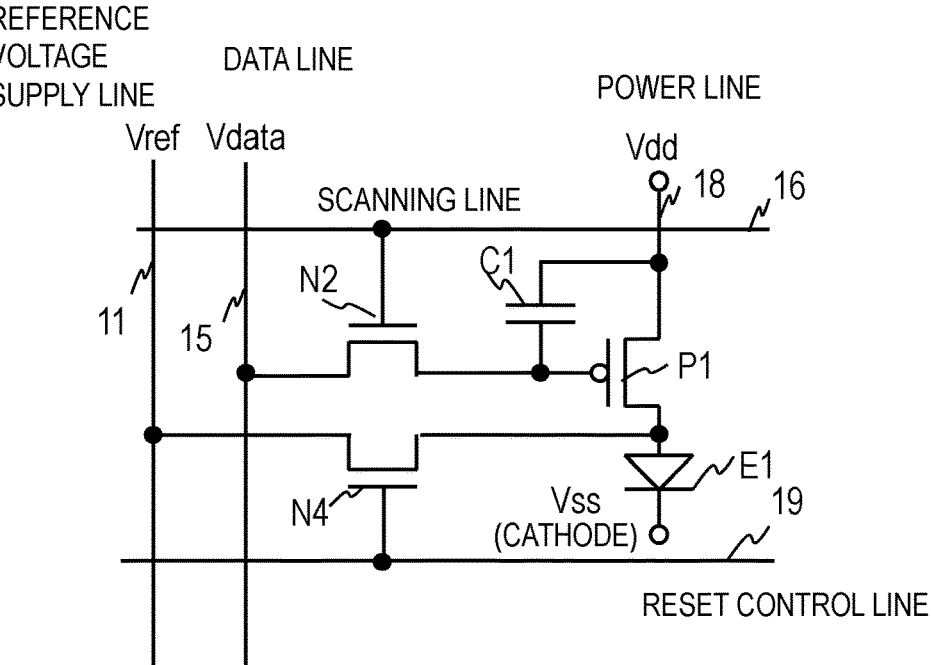
FIG. 2B illustrates another configuration example of a pixel circuit.

FIG. 2B illustrates another configuration example of a pixel circuit. This pixel circuit includes a reset transistor N4 in place of the emission transistor N3 in FIG. 2A. The reset transistor N4 is an n-channel type of oxide semiconductor TFT. The reset transistor N4 controls the electric connection between a reference voltage supply line 11 and the anode of the OLED element E1. This control is performed in accordance with a reset control signal supplied from a reset control line 19 to the gate terminal of the reset transistor N4. This reset transistor N4 can be used for various purposes.

Figure 2C:
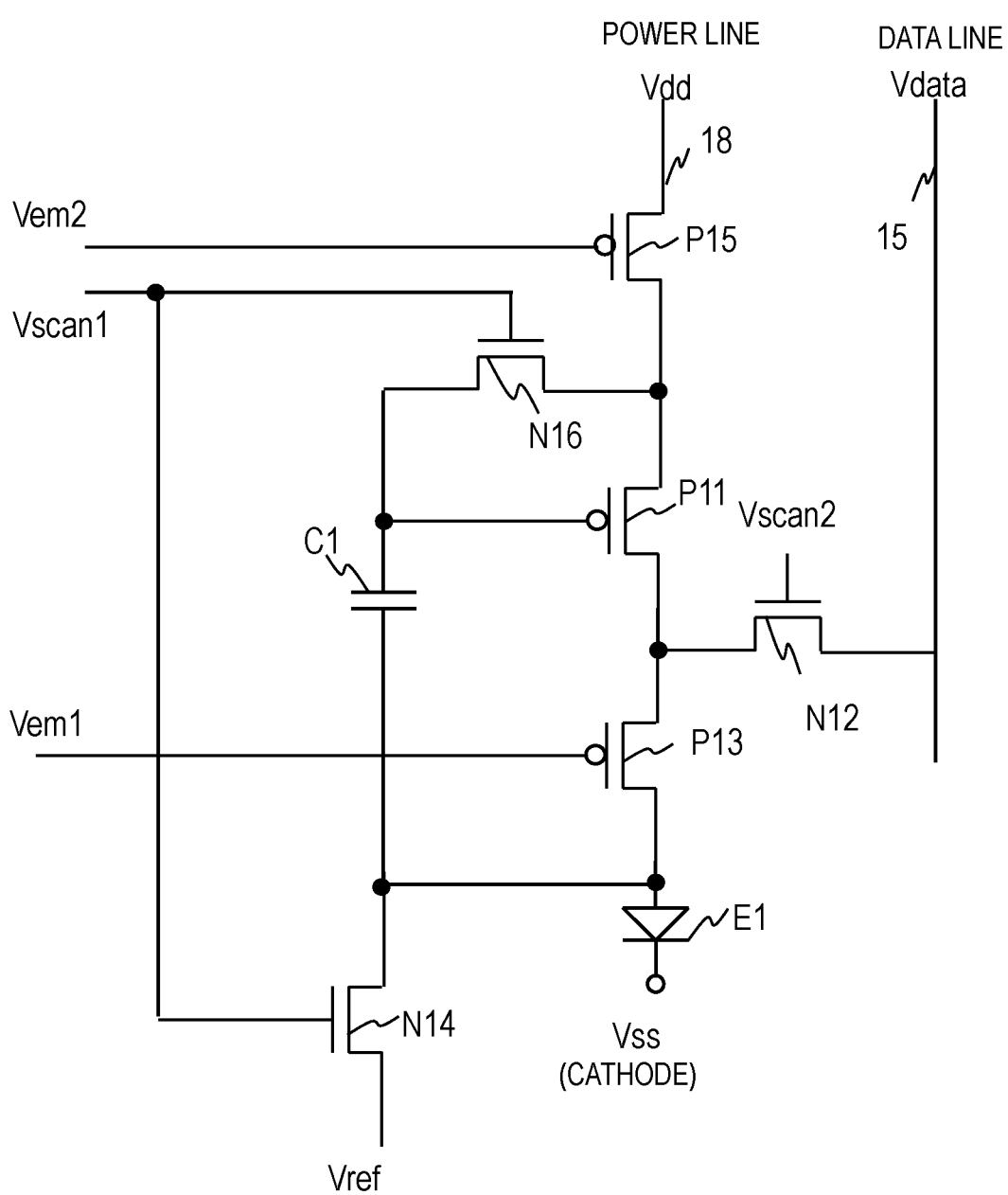
FIG. 2C illustrates still another configuration example of a pixel circuit.

FIG. 2C illustrates still another configuration example of a pixel circuit. This pixel circuit includes transistors P11, P13, P15, N12, N14, and N16. The gate terminal of the transistor N12 is supplied with a Vscan2 signal and the gate terminals of the transistors N14 and N16 are supplied with a Vscan1 signal. A storage capacitor C1 is supplied with a data voltage through the transistors N12, P11, and N16. The transistor N14 supplies a reference voltage Vref to the anode of an OLED element E1. The gate terminals of the transistors P13 and P15 are supplied with signals Vem1 and Vem2 to control whether to light the OLED element E1.

For example, the driving transistors P11, P13, and P15 are low-temperature polysilicon TFTs and the transistors N12, N14, and N16 are oxide semiconductor TFTs. A source/drain region of the driving transistor P11 and a source/drain region of the transistor N16 are connected. The pixel circuit configurations in FIGS. 2A, 2B, and 2C are examples; a pixel circuit can have another circuit configuration. One of the low-resistive regions becomes a source region and the other one becomes a drain region and their roles can be exchanged, depending on the operation of the TFT. For this reason, a low-resistive region is referred to as source/drain region.

The above-described pixel circuits include a low-temperature polysilicon TFT and an oxide semiconductor TFT whose source/drain regions are connected to each other. The configurations of the connection described in this specification reduce the number of contact holes and contribute to achievement of higher resolution.

Connection of Low-Temperature Polysilicon TFT and Oxide Semiconductor TFT

Hereinafter, configuration examples of interconnection of a low-temperature polysilicon TFT and an oxide semiconductor are described. The oxide semiconductor in the examples described in the following is indium gallium zinc oxide (IGZO). The configurations in this specification are applicable to a TFT of another oxide semiconductor such as zinc oxide or tin dioxide.

Figure 3:
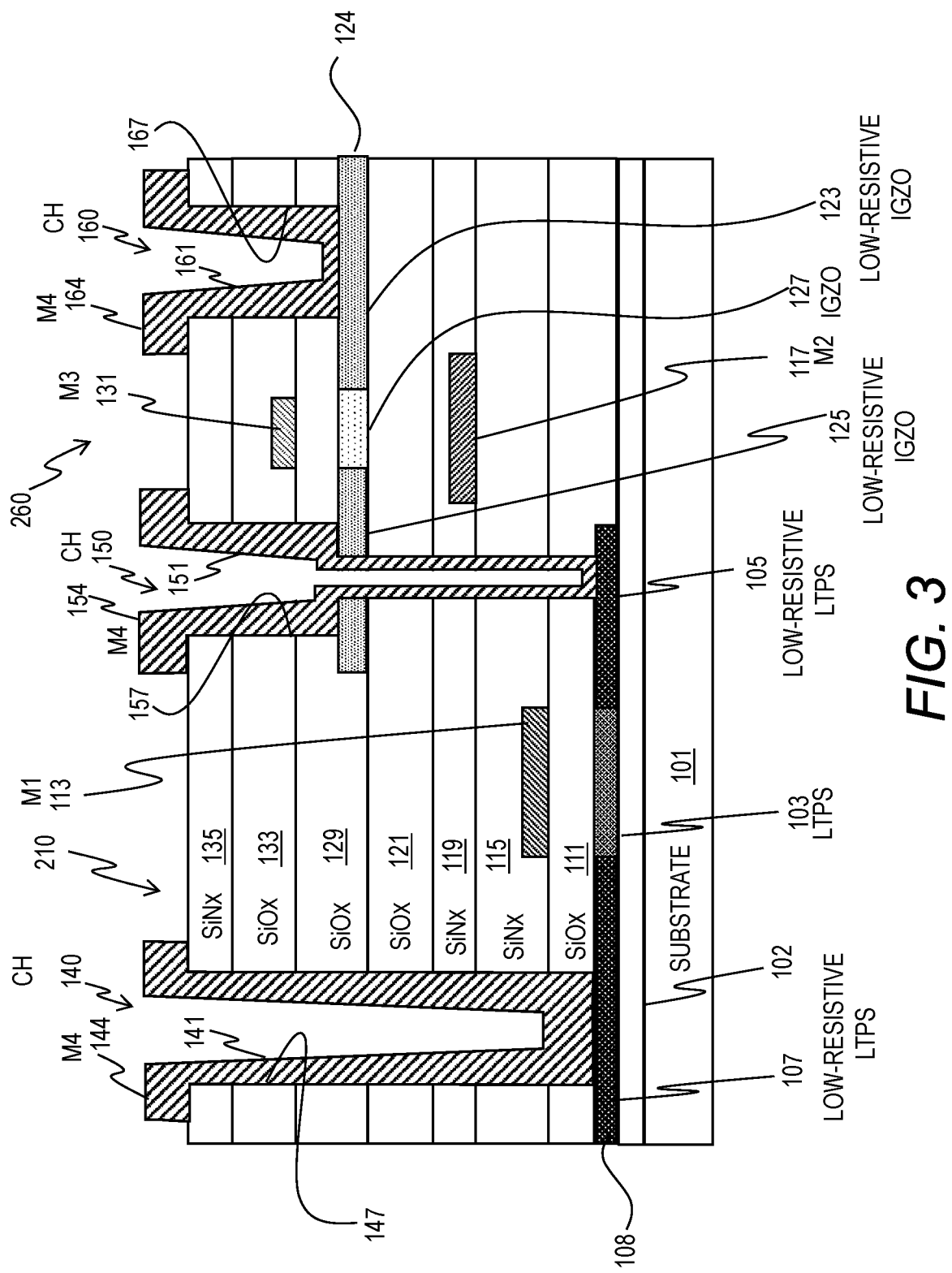
FIG. 3 illustrates cross-sectional structures of a low-temperature polysilicon TFT and an oxide semiconductor TFT whose low-resistive regions are interconnected by a single contact hole.

FIG. 3 illustrates cross-sectional structures of a low-temperature polysilicon TFT 210 and an oxide semiconductor TFT 260 whose source/drain regions (low-resistive regions) are interconnected by a single contact hole. These TFTs are the first and the second TFTs. The low-temperature polysilicon TFT 210 and the oxide semiconductor TFT 260 are fabricated on a flexible or rigid insulating substrate 101 made of resin or glass.

A silicon nitride layer 102 is laid on the insulating substrate 101 and a low-temperature polysilicon layer (active layer) 108 of the low-temperature polysilicon TFT 210 is laid above the silicon nitride layer 102. The low-temperature polysilicon layer includes low-resistive regions 105 and 107 and a channel region 103.

The low-temperature polysilicon layer 108 includes low-resistive regions (low-resistive LTPS) 105 and 107 and a highly-resistive channel region (LTPS) 103 sandwiched between the low-resistive regions 105 and 107 in an in-plane direction. The low-resistive regions 105 and 107 are source/drain regions.

The low-resistive regions 105 and 107 are made of low-temperature polysilicon reduced in resistance by high-concentration impurity doping. The channel region 103 is made of low-temperature polysilicon not reduced in resistance (highly-resistive low-temperature polysilicon).

The low-temperature polysilicon TFT 210 further includes a gate electrode 113 and a gate insulating layer 111 located between the gate electrode 113 and the low-temperature polysilicon layer 108 in the layering direction. The low-temperature polysilicon layer 108, the gate insulating layer 111, and the gate electrode 113 are laid one above another in this order from the bottom (the side closer to the substrate) and the gate insulating layer 111 is in direct contact with the low-temperature polysilicon layer 108 and the gate electrode 113.

The gate electrode 113 is made of metal and included in an M1 metal layer. The gate insulating layer 111 in this example is made of silicon oxide (SiOx). Although the low-temperature polysilicon TFT 210 in the example of FIG. 3 has a top-gate structure, it can have a bottom-gate structure or a structure having both a top-gate electrode and a bottom-gate electrode.

The oxide semiconductor TFT 260 includes a bottom-gate electrode 117, a top-gate electrode 131, and an oxide semiconductor layer (active layer) 124 located therebetween. The oxide semiconductor layer 124 includes low-resistive regions (low-resistive IGZO) 123 and 125 and a highly-resistive channel region (IGZO) 127 sandwiched between the low-resistive regions 123 and 125 in an in-plane direction. The low-resistive regions 123 and 125 are made of IGZO reduced in resistance. The channel region 127 is made of IGZO not reduced in resistance (highly-resistive IGZO).

An insulating layer 115 is laid above the gate insulating layer 111 and the gate electrode 113 to cover them. The insulating layer 115 is made of silicon nitride (SiNx). The bottom-gate electrode 117 is laid above the insulating layer 115. The bottom-gate electrode 117 is made of metal and included in an M2 metal layer.

A gate insulating layer is provided between the bottom-gate electrode 117 and the oxide semiconductor layer 124. The gate insulating layer in the configuration example of FIG. 3 is a stack of two insulating layers 119 and 121. The insulating layer 119 is made of silicon nitride and the insulating layer 121 is made of silicon oxide.

The bottom-gate electrode 117, the insulating layers 119 and 121, and the oxide semiconductor layer 124 are laid one above another in this order from the bottom (the side closer to the substrate). The insulating layer 119 is in direct contact with the bottom-gate electrode 117 and the insulating layer 121 and the insulating layer 121 is in direct contact with the oxide semiconductor layer 124.

The oxide semiconductor layer 124 is laid above the insulating layer 121. A gate insulating layer 129 is provided between the oxide semiconductor layer 124 and the top-gate electrode 131. The gate insulating layer 129 is made of silicon oxide. The oxide semiconductor layer 124, the insulating layer 129, and the top-gate electrode 131 are laid one above another in this order from the bottom (the side closer to the substrate). The insulating layer 129 is in direct contact with the top-gate electrode 131 and the oxide semiconductor layer 124. The top-gate electrode 131 is made of metal and included in an M3 metal layer. Either the top-gate electrode 131 or the bottom-gate electrode 117 can be excluded.

An insulating layer 133 is laid above the top-gate electrode 131 and the insulating layer 129 to cover them. Furthermore, another insulating layer 135 is laid above the insulating layer 133. The insulating layer 133 is made of silicon oxide and the insulating layer 135 is made of silicon nitride.

Three contact holes (CH) 140, 150, and 160 are included in FIG. 3. The contact hole 140 interconnects the low-resistive region 107 and a source/drain line 144 of the low-temperature polysilicon TFT 210. The contact hole 140 includes a metal contact region 141.

The contact region 141 extends through the insulating layers 135, 133, 129, 121, 119, 115, and 111 and is in direct contact with the low-resistive region 107 of the low-temperature polysilicon layer 108. The multi-layered structure consisting of the insulating layers 135, 133, 129, 121, 119, 115, and 111 has a through-hole 147. The contact region 141 is provided to stick to the inner surface of the through-hole 147. The source/drain line 144 is laid above the insulating layer 135. The contact region 141 and the source/drain line 144 are made of the same material and unseparated; they are included in an M4 metal layer.

The contact hole 150 interconnects the low-resistive region 105 of the low-temperature polysilicon TFT 210 and the low-resistive region 125 of the oxide semiconductor TFT 260. The low-resistive region 105 of the low-temperature polysilicon layer 108 is located lower than the low-resistive region 125 of the oxide semiconductor layer 124.

The contact hole 150 includes a metal contact region 151. The insulating layers 135, 133, and 129 are located between the layer of the metal contact region 151 and the oxide semiconductor layer 124. The insulating layers 121, 119, 115, and 111 are located between the oxide semiconductor layer 124 and the low-temperature polysilicon layer 108.

The low-resistive region 125 of the oxide semiconductor layer 124 at least partially overlap the low-resistive region 105 of the low-temperature polysilicon layer 108 when viewed in the layering direction. The layering direction is the vertical direction in FIG. 3.

The contact region 151 extends through the insulating layers 135, 133 and 129, the oxide semiconductor layer 124, and the insulating layers 121, 119, 115, and 111 and is in direct contact with the low-resistive region 105 of the low-temperature polysilicon layer 108. The multi-layered structure consisting of the insulating layers 135, 133 and 129, the oxide semiconductor layer 124, and the insulating layers 121, 119, 115, and 111 has a through-hole 157. The inner diameter of the through-hole 157 changes unsmoothly at the oxide semiconductor layer 124. Specifically, the smallest inner diameter of the through-hole 157 in the part upper than the oxide semiconductor layer 124 is larger than the largest inner diameter of the through-hole 157 in the part lower than the oxide semiconductor layer 124.

The contact region 151 is provided to stick to the inner surface of the through-hole 157. The outer diameter of the contact region 151 changes unsmoothly at the oxide semiconductor layer 124. Specifically, the smallest outer diameter of the contact region 151 in the part upper than the oxide semiconductor layer 124 is larger than the largest outer diameter of the contact region 151 in the part lower than the oxide semiconductor layer 124.

The through-hole 157 extends through the low-resistive region 125 of the oxide semiconductor layer 124. The contact region 151 extends through the low-resistive region 125 and is in direct contact with the top face of the low-resistive region 125 and the inner surface (side wall) of the hole therein. The contact region 151 is also in direct contact with the top face of the low-resistive region 105 of the polysilicon layer 108. The contact region 151 is included in the M4 metal layer. The contact region 151 may interconnect a source/drain line 154 above the insulating layer 135 and the oxide semiconductor layer 124. This source/drain line 154 is included in the pattern of the M4 metal layer.

The contact hole 160 includes a metal contact region 161. The contact region 161 extends through the insulating layers 135, 133, and 129 and is in direct contact with the low-resistive region 123 of the oxide semiconductor layer 124. The multi-layered structure consisting of the insulating layers 135, 133, and 129 has a through-hole 167. The contact region 161 is provided to stick to the inner surface of the through-hole 167. A source/drain line 164 is provided above the insulating layer 135. The contact region 161 and the source/drain line 164 are made of the same material and unseparated; they are included in the M4 metal layer.

Figure 4A:
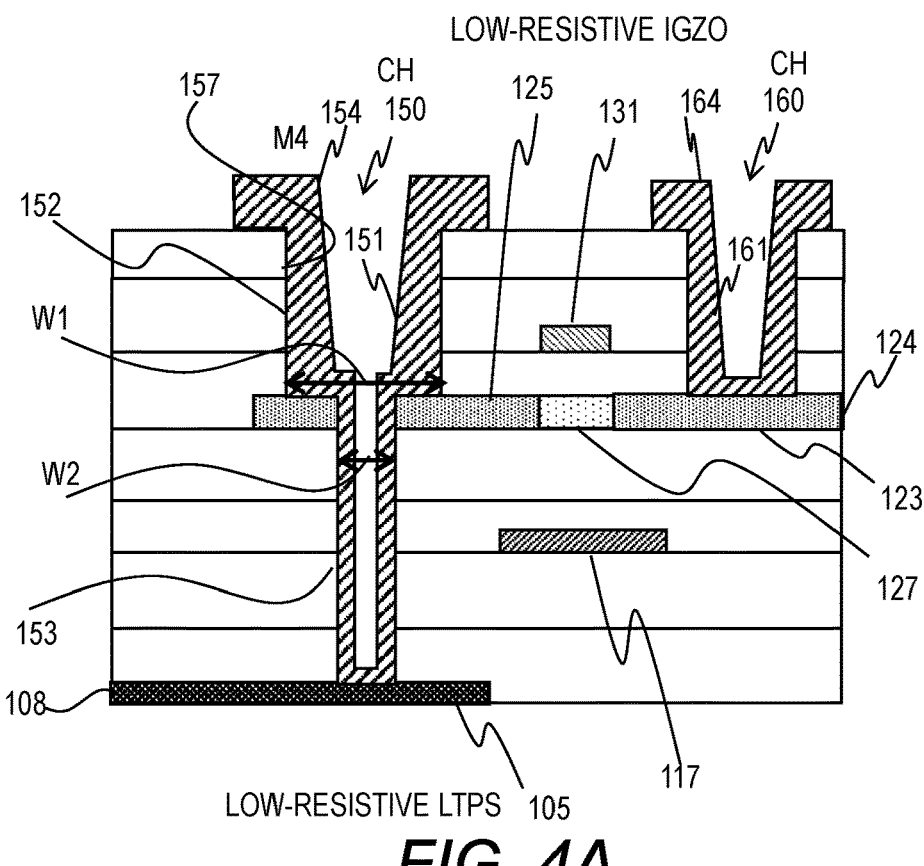
FIG. 4A schematically illustrates cross-sectional structures of contact holes.
Figure 4B:
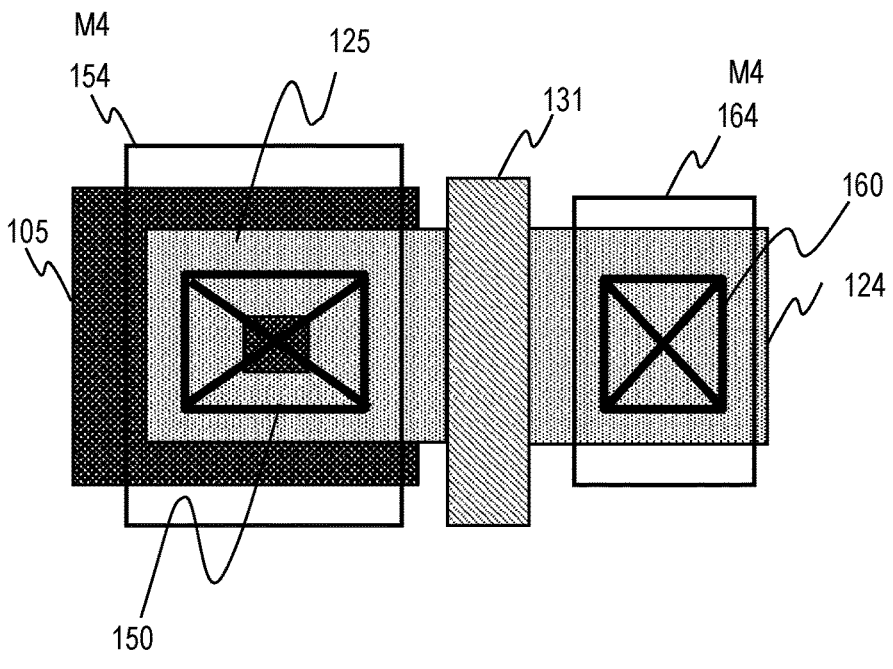
FIG. 4B schematically illustrates planar structures of the contact holes.

FIG. 4A schematically illustrates the cross-sectional structures of the contact holes 150 and 160 and FIG. 4B schematically illustrates the planar structures of the contact holes 150 and 160. The M4 metal layer including the metal contact regions 151 and 161 can be a single metal layer or a stack of metal layers. Each layer can be made of a single metal or an alloy. For example, a stack of Ti/Al/Ti can be employed.

The contact region 151 includes an upper part 152 located upper than the top face of the oxide semiconductor layer 124 and a lower part 153 thereunder continued from the upper part 152. The upper part 152 extends through the stack of insulating layers upper than the oxide semiconductor layer 124 and is in direct contact with the top face of the low-resistive region 125. The inner diameter of the through-hole in the stack of insulating layers upper than the oxide semiconductor layer 124 is denoted by W1. In the configuration example of FIG. 4A, the inner diameter W1 of the through-hole 157 in the part upper than the oxide semiconductor layer 124 is substantially the same.

The lower part 153 of the contact region 151 extends through the oxide semiconductor layer 124 and the stack of insulating layers thereunder and is in direct contact with the inner surface of the hole in the low-resistive region 125 of the oxide semiconductor layer 124 and the top face of the low-resistive region 105 of the low-temperature polysilicon layer 108. The inner diameter of the through-hole in the stack of lower insulating layers is denoted by W2. In the configuration example of FIG. 4A, the inner diameter W2 of the through-hole 157 in the part lower than the oxide semiconductor layer 124 is substantially the same. The inner diameter of the through-hole 157 changes unsmoothly at the oxide semiconductor layer 124; the largest inner diameter W2 is smaller than the smallest inner diameter W1. This configuration enables the components located lower than the oxide semiconductor layer 124 to be disposed more densely.

When viewing the contact hole 150 from above, the oxide semiconductor layer 124 and the low-temperature polysilicon layer 108 can be seen together as illustrated in FIG. 4B. More specifically, the low-resistive region 125 of the oxide semiconductor layer 124 and the low-resistive region 105 of the low-temperature polysilicon layer 108 can be seen together. The low-resistive region 125 of the oxide semiconductor layer 124 overlaps the low-resistive region 105 of the low-temperature polysilicon layer 108 within the through-hole 157. The through-hole 157 in the part of the insulating layers upper than the oxide semiconductor layer 124 is located inner than the perimeter of the low-resistive region 125.

Figure 5A:
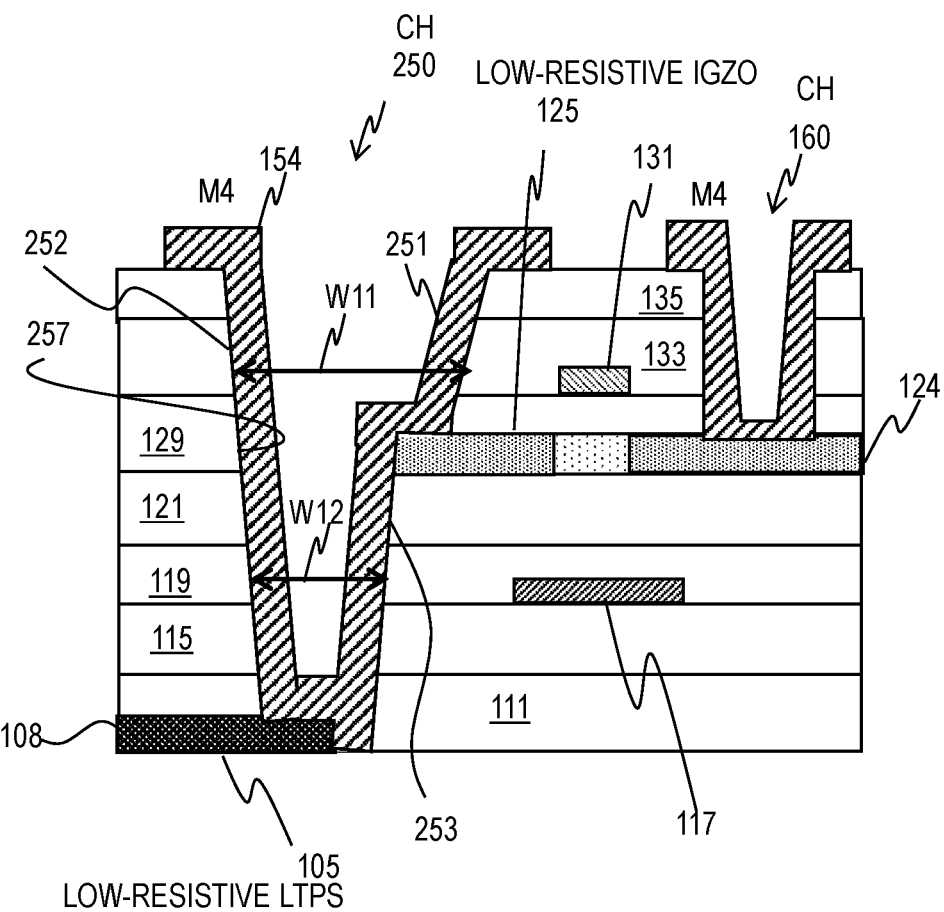
FIG. 5A schematically illustrates a cross-sectional structure of a contact hole interconnecting low-resistive regions of an oxide semiconductor layer and a polysilicon layer.
Figure 5B:
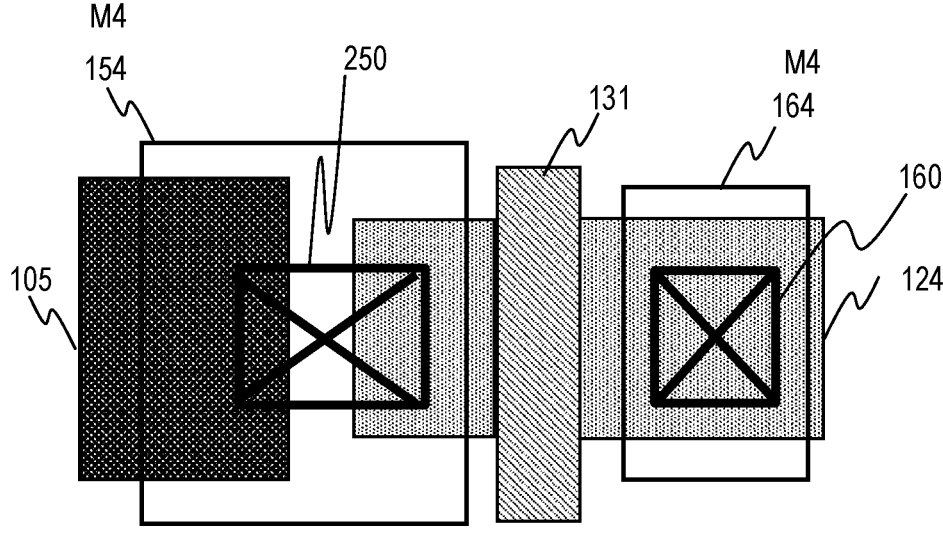
FIG. 5B schematically illustrates a planar structure of the contact hole interconnecting low-resistive regions of an oxide semiconductor layer and a polysilicon layer.

FIGS. 5A and 5B illustrate another structural example of a contact hole interconnecting low-resistive regions of the oxide semiconductor layer and the polysilicon layer. FIG. 5A schematically illustrates the cross-sectional structure and FIG. 5B schematically illustrates the planar structure. In this configuration example, the oxide semiconductor layer 124 does not overlap but is distant from the low-temperature polysilicon layer 108 when viewed in the layering direction. The configurations of the oxide semiconductor layer 124 and the low-temperature polysilicon layer 108 are identical to those in the configuration example in FIGS. 4A and 4B and accordingly, they are denoted by the same reference signs. The contact hole 250 interconnects the low-resistive region 105 of the low-temperature polysilicon TFT 210 and the low-resistive region 125 of the oxide semiconductor TFT 260.

The multi-layered structure consisting of the insulating layers 135, 133, 129, 121, 119, 115, and 111 has a through-hole 257. The inner diameter of the through-hole 257 changes unsmoothly at the oxide semiconductor layer 124. Specifically, the smallest inner diameter in the part upper than the oxide semiconductor layer 124 is larger than the largest inner diameter in the part lower than the oxide semiconductor layer 124.

A contact region 251 is provided to stick to the inner surface of the through-hole 257. The contact hole 250 includes the metal contact region 251. The contact region 251 extends through the insulating layers 135, 133, 129, 121, 119, 115, and 111. The outer diameter of the contact region 251 changes unsmoothly at the oxide semiconductor layer 124. Specifically, the smallest outer diameter in the part upper than the oxide semiconductor layer 124 is larger than the largest outer diameter in the part lower than the oxide semiconductor layer 124.

The through-hole 257 does not pass through the oxide semiconductor layer 124 and a part of the low-resistive region 125 including its side end is exposed in the through-hole 257. The contact region 251 is in direct contact with the top face and an end (side) face of the low-resistive region 125. The contact region 251 is also in direct contact with the top face and an end (side) face of the low-resistive region 105 of the polysilicon layer 108. The contact region 251 is included in the M4 metal layer.

The contact region 251 includes an upper part 252 located upper than the top face of the oxide semiconductor layer 124 and a lower part 253 thereunder continued from the upper part 252. The upper part 252 extends through the stack of insulating layers upper than the oxide semiconductor layer 124 and is in direct contact with the top face of the low-resistive region 125. The inner diameter of the through-hole 257 in the part in the stack of insulating layers upper than the oxide semiconductor layer 124 is denoted by W11. In the configuration example of FIG. 5A, the inner diameter W11 of the through-hole 257 upper than the oxide semiconductor layer 124 decreases from the top toward the bottom.

The lower part 253 of the contact region 251 extends through the stack of insulating layers lower than the oxide semiconductor layer 124 and is in direct contact with an end face of the low-resistive region 125 of the oxide semiconductor layer 124, the top face and an end face of the low-resistive region 105 of the low-temperature polysilicon layer 108. The inner diameter of the through-hole 257 in the part lower than the underside of the oxide semiconductor layer 124 is denoted by W12. In the configuration example of FIG. 5A, the inner diameter W12 of the through-hole 257 lower than the oxide semiconductor layer 124 decreases from the top toward the bottom. The inner diameter of the through-hole 257 changes unsmoothly at the oxide semiconductor layer 124; the largest inner diameter W12 is smaller than the smallest inner diameter W11.

The upper part 252 and the lower part 253 of the contact region 251 are tapered in accordance with the change in inner diameter of the through-hole 257. As a result, the contact region 251 is thicker in the part in contact with the end (side) face of the oxide semiconductor layer 124, preventing discontinuity of the contact region 251.

When viewing the contact hole 250 from above, the oxide semiconductor layer 124 and the low-temperature polysilicon layer 108 can be seen together as illustrated in FIG. 5B. More specifically, the low-resistive region 125 of the oxide semiconductor layer 124 and the low-resistive region 105 of the low-temperature polysilicon layer 108 can be seen together. Inside the through-hole 257, the low-resistive region 105 of the low-temperature polysilicon layer 108 does not overlap but is distant from the low-resistive region 125 of the oxide semiconductor layer 124.

Manufacturing Method

Figure 6:
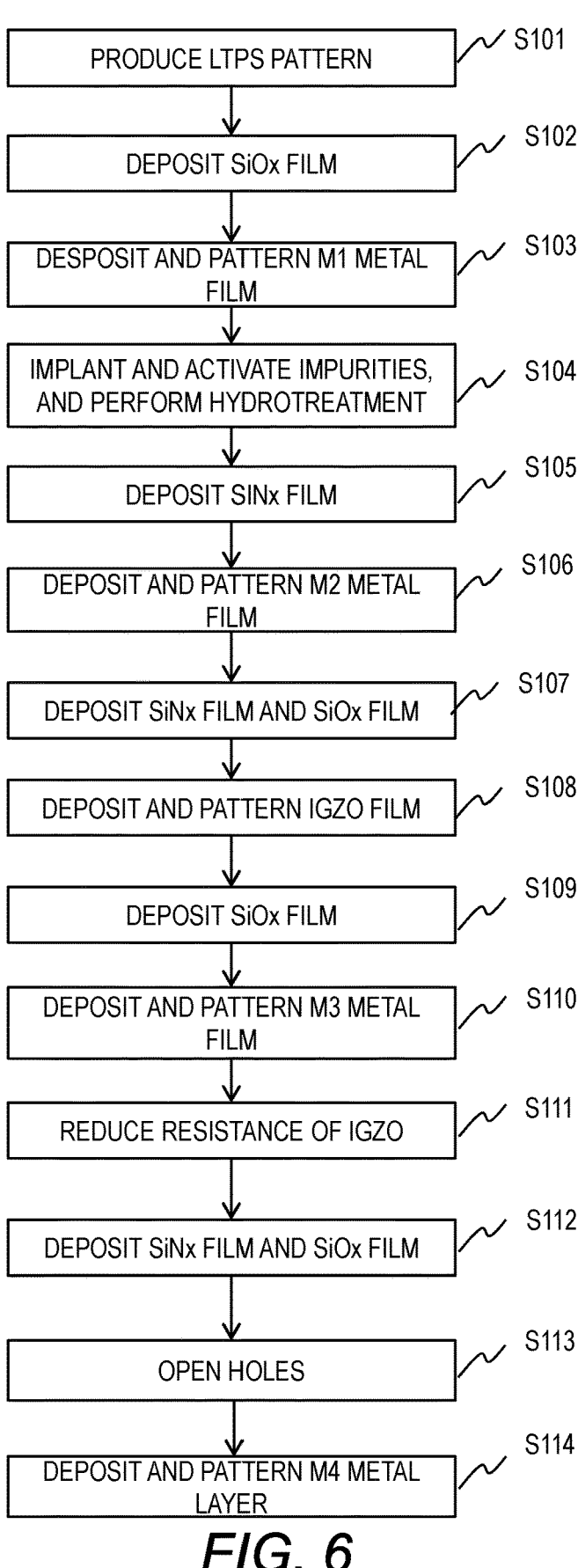
FIG. 6 is a flowchart of an example of a manufacturing method.

A method of manufacturing the TFTs 210 and 260 illustrated in FIG. 3 is described. FIG. 6 is a flowchart of an example of the method of manufacturing these TFTs. The method first forms a silicon nitride layer on an insulating substrate 101 by CVD and then, a low-temperature polysilicon layer (S101). Specifically, the method deposits amorphous silicon by CVD and crystalizes the amorphous silicon by excimer laser annealing to form a (low-temperature) polysilicon film. The polysilicon film is patterned into islands by photolithography.

Next, the method forms a silicon oxide layer by CVD (S102). The method further forms an M1 metal layer by sputtering, and patterns the M1 metal layer by photolithography (S103). The material for the M1 metal layer can be selected desirably from Mo, W, Nb, and Al, for example. The M1 metal layer can have a single layer structure or a multi-layered structure.

Next, the method implants impurities to the source/drain regions of the polysilicon layer using the gate electrode 113 (the M1 metal layer) as a mask and activates the impurities. Further, the method terminates the dangling bonds by hydrotreatment (S104). As a result, the source/drain regions are reduced in resistance.

Next, the method forms a silicon nitride layer by CVD (S105). Further, the method forms an M2 metal layer by sputtering and patterns the M2 metal layer by photolithography (S106). The material for the M2 metal layer can be selected desirably from Mo, W, Nb, and Al, for example. The M2 metal layer can have a single layer structure or a multi-layered structure.

Next, the method forms a silicon nitride layer and a silicon oxide layer by CVD (S107). Further, the method forms an IGZO layer by sputtering and patterns the IGZO layer by photolithography (S108). At this time, a hole for the contact hole 150 is opened through the IGZO layer.

Next, the method forms a silicon oxide layer (S109). Next, the method forms an M3 metal layer by sputtering and patterns the M3 metal layer by photolithography (S110). The material for the M3 metal layer can be selected desirably from Mo, W, Nb, and Al, for example. The M3 metal layer can have a single layer structure or a multi-layered structure.

Next, the method reduces the resistance of the source/drain regions of the IGZO layer using the gate electrode 131 (the M3 metal layer) as a mask (S111). The resistance can be reduced by exposing the source/drain regions of the IGZO layer to He plasma or by implanting B, Ar, or H ions.

Next, the method forms a silicon nitride layer and a silicon oxide layer (S112). Next, the method opens holes for contact holes in the stack of insulating layers by anisotropic etching (S113).

Next, the method forms an M4 metal layer by sputtering and patterns the M4 metal layer by photolithography (S114). The M4 metal layer includes source/drain lines and contact regions of contact holes. The M4 metal layer can be formed by depositing and patterning conductive films of Ti/Al/Ti, for example.

Figure 7A:
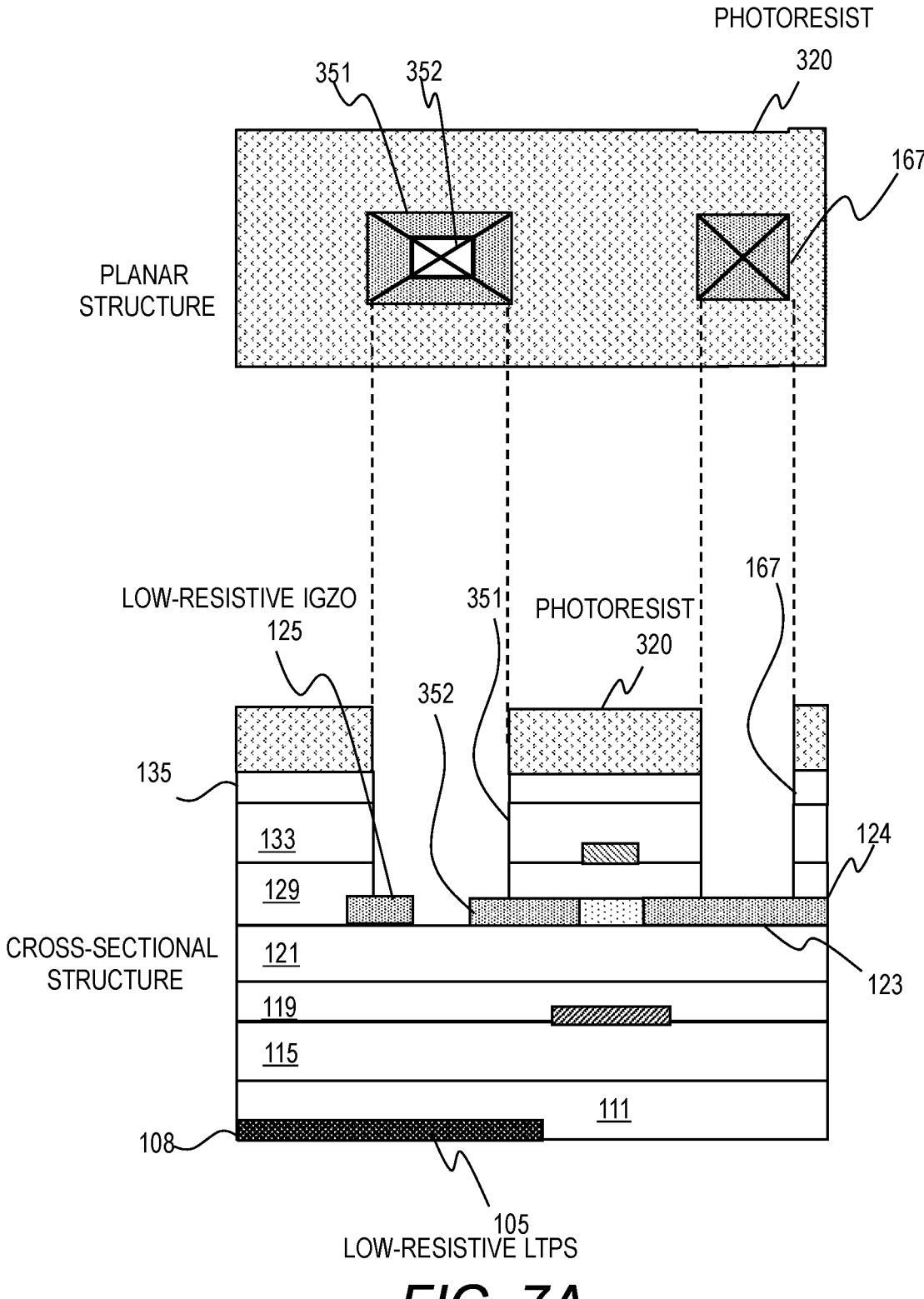
FIG. 7A is a diagram for explaining a method of producing contact holes.
Figure 7B:
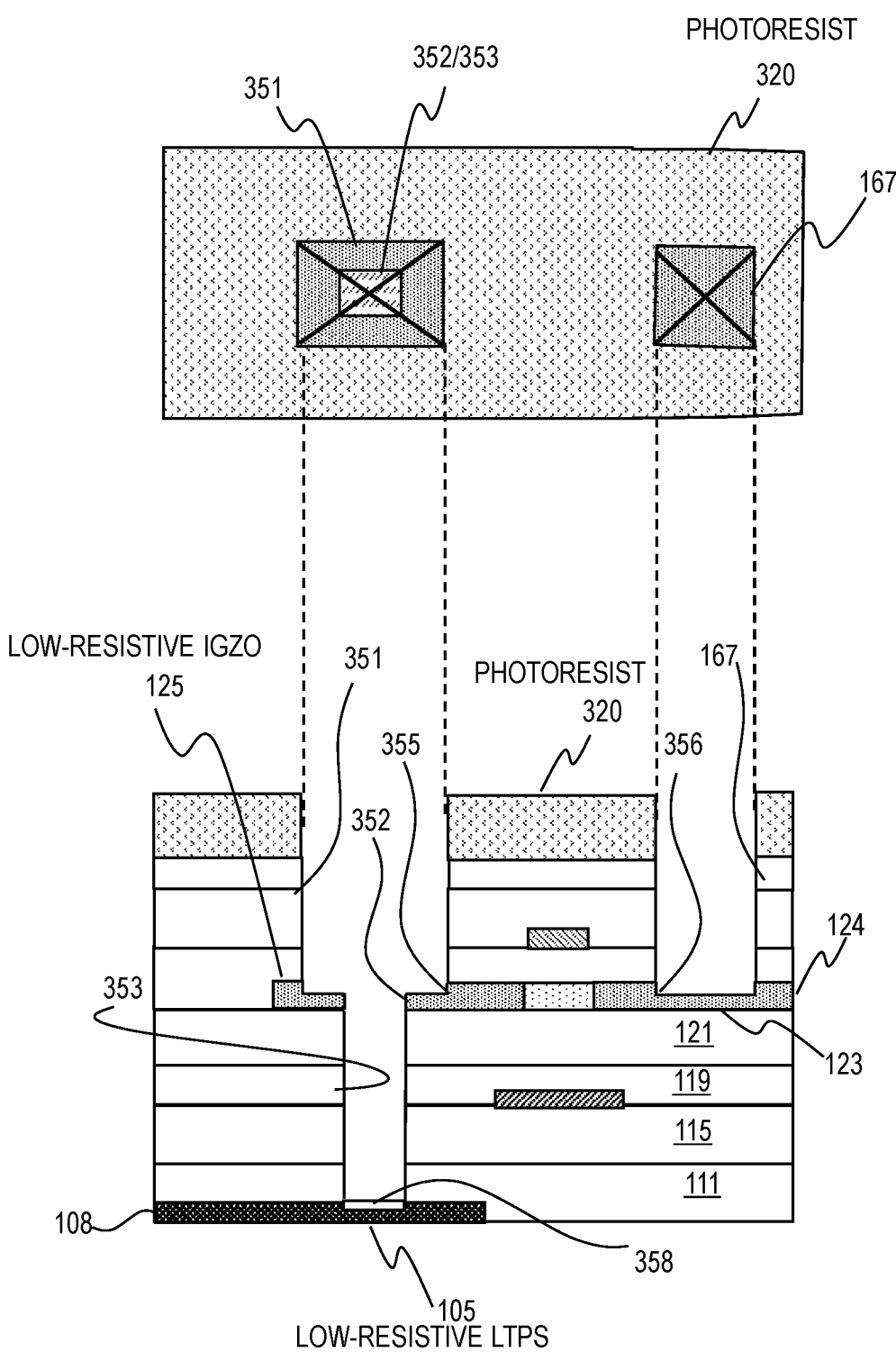
FIG. 7B is a diagram for explaining a method of producing contact holes.
Figure 7C:
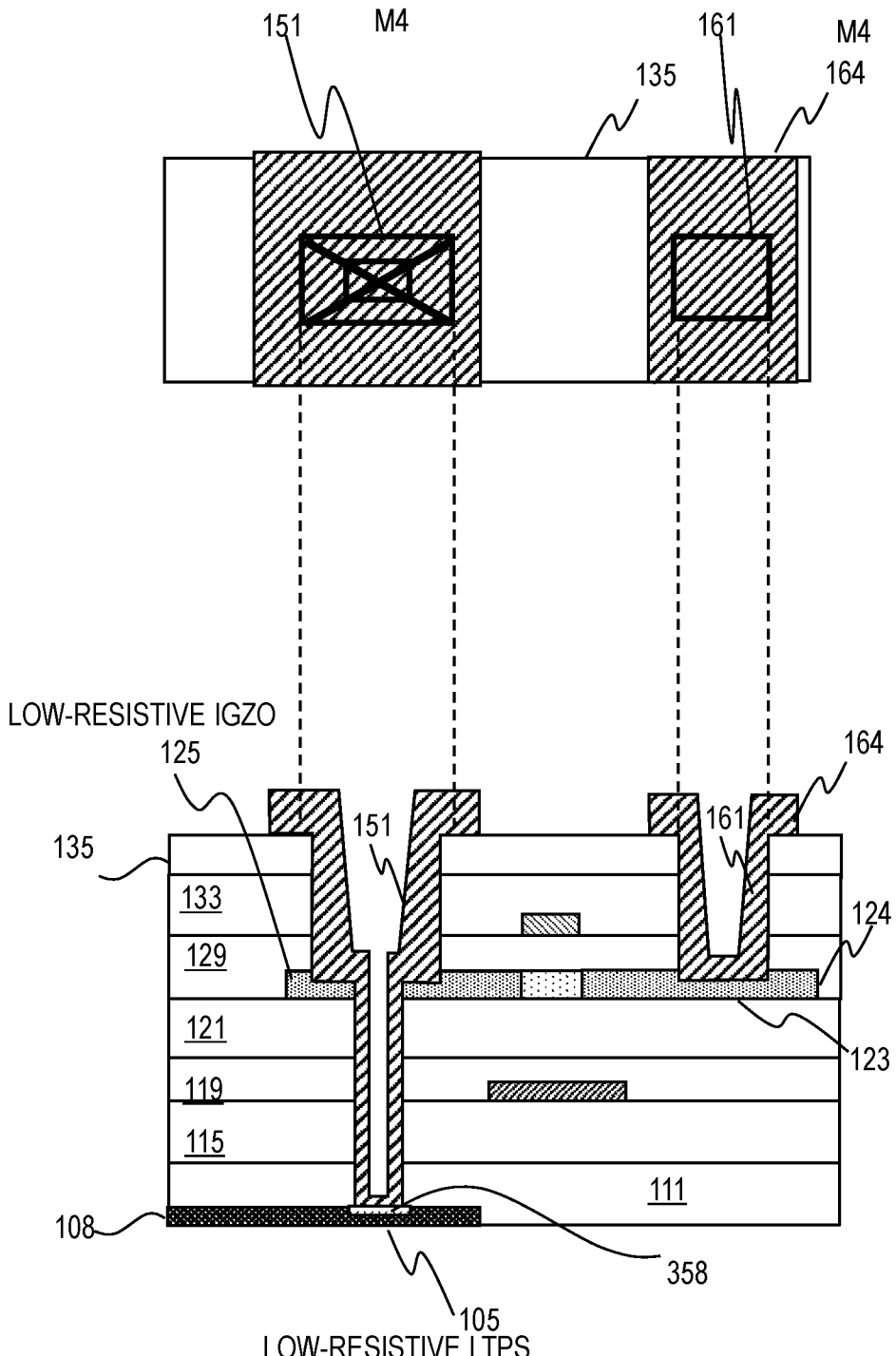
FIG. 7C is a diagram for explaining a method of producing contact holes.

The following describes details of producing contact holes. FIGS. 7A to 7C are diagrams for explaining the method of producing the contact holes 150 and 160 (S113 and S114). Each of FIGS. 7A to 7C illustrates the planar structure and the cross-sectional structure at a different step in producing the contact holes.

FIG. 7A schematically illustrates a state where the insulating layers upper than the oxide semiconductor layer 124 are etched using a photoresist pattern 320 as a mask. For example, plasma etching can be employed. The photoresist pattern 320 is laid above the insulating layer 135. As described above, a hole 352 is opened through the oxide semiconductor layer 124 before providing the photoresist pattern 320.

A hole 351 is opened through the stack of the insulating layers 129, 133, and 135. The low-resistive region 125 of the oxide semiconductor layer 124 and the hole 352 therein are exposed within the hole 351. Specifically, the top face and the end face (the inner wall of the hole 352) of the low-resistive region 125 are exposed. Another hole 167 is opened through the stack of the insulating layers 129, 133, and 135. The top face of the low-resistive region 123 of the oxide semiconductor layer 124 is exposed within the hole 167.

FIG. 7B illustrates a state where the product in process in the state of FIG. 7A is further etched. A hole 353 continued from the hole 352 is opened through the stack of the insulating layers 111, 115, 119, and 121. The diameter of the hole 353 is smaller than the diameter of the hole 351. The hole 351, 352, and 353 are continued to form a single hole 157 as described with reference to FIGS. 3 and 4A.

The low-resistive region 125 of the oxide semiconductor layer 124 in the hole 351 is over-etched around its hole 352, so that the top face of the low-resistive region 125 has a recess 355. For this reason, the low-resistive region 125 is thinner in the hole 351 than in the outside the hole 351. In similar, the low-resistive region 123 in the hole 167 is over-etched, so that the top face of the low-resistive region 123 has a recess 356. The low-resistive region 123 is thinner in the hole 167 than in the outside the hole 167.

As noted from this description, the damage by this etching generates more oxygen vacancies to reduce the resistance further. As a result, the contact resistance with the metal contact region is reduced more. The low-resistive region 105 of the low-temperature polysilicon layer 108 is exposed within the hole 353; a natural oxide film 358 is generated on its surface by the etching. In this example, the natural oxide film 358 is kept remaining. The natural oxide film 358 is a part of the low-resistive region 105.

FIG. 7C illustrates a state where the M4 metal layer is provided on the product in process in the state of FIG. 7B. The contact region 151 interconnects the low-resistive region 125 of the oxide semiconductor layer 124 and the low-resistive region 105 of the low-temperature polysilicon layer 108. The contact region 161 interconnects the source/drain line 164 and the low-resistive region 123 of the oxide semiconductor layer 124.

Next, another method of opening contact holes is described. The method described in the following removes the natural oxide film of the low-temperature polysilicon layer. This process further reduces the contact resistance between the metal contact region and the low-resistive region of the low-temperature polysilicon layer.

Figure 8A:
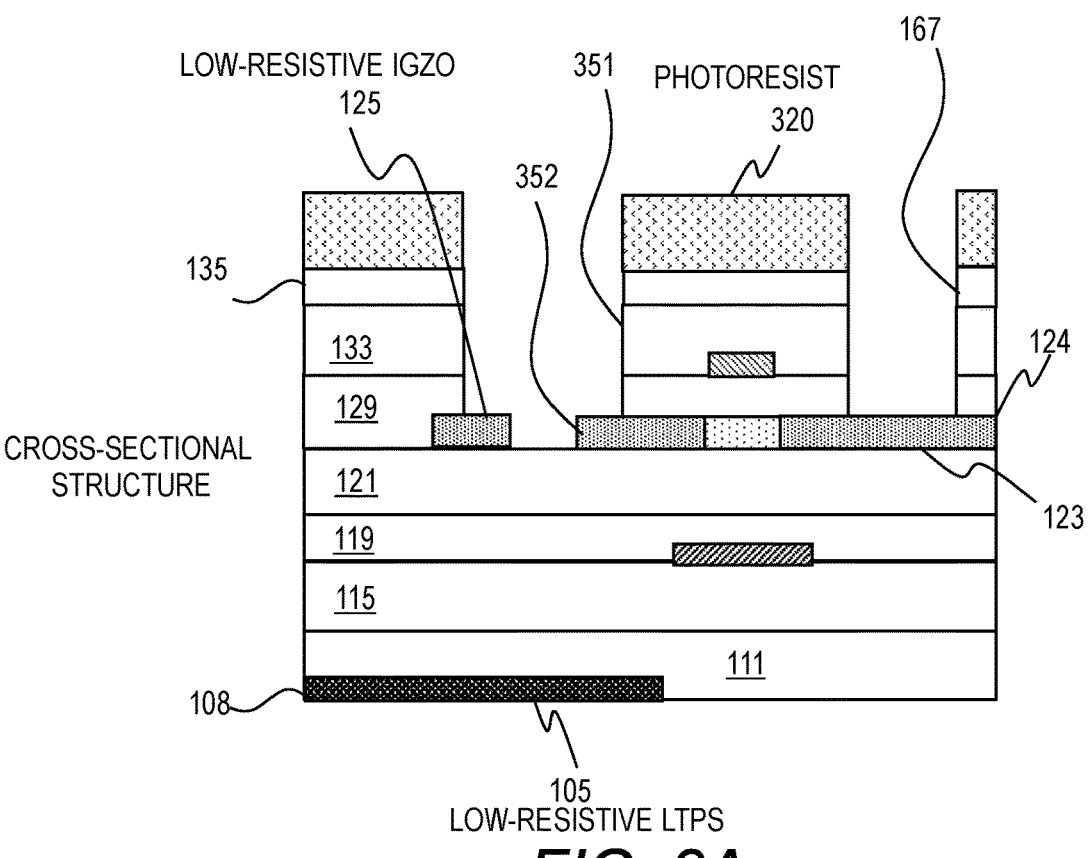
FIG. 8A illustrates a state identical to the state in FIG. 7A.
Figure 8B:
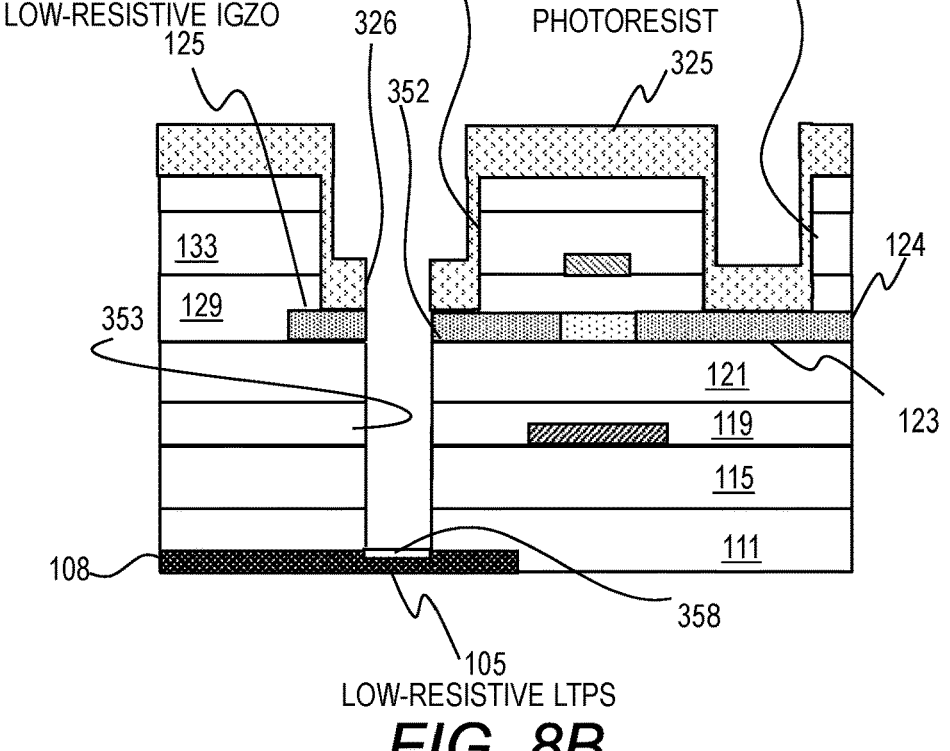
FIG. 8B illustrates a state where the photoresist pattern is removed from the product in process in the state of FIG. 8A and a hole 353 is opened using a newly provided photoresist pattern as a mask.

FIG. 8A illustrates a state identical to the state in FIG. 7A. FIG. 8B illustrates a state where the photoresist pattern 320 is removed from the product in process in the state of FIG. 8A and a hole 353 is opened using a newly provided second photoresist pattern 325 as a mask. The photoresist pattern 325 covers the inner surface of the hole 167 and the top face of the low-resistive region 123 of the oxide semiconductor layer 124.

The photoresist pattern 325 also covers the entire inner wall of the hole 351 and the top face of the low-resistive region 125 of the oxide semiconductor layer in the hole 351 (the peripheral region around the hole 352). The photoresist pattern 325 has a hole 326 continued to the hole 352 of the low-resistive region 125. Before etching, the insulating layer 121 is exposed in the hole 326. A hole 353 is opened through the stack of insulating layers by etching. At this time, the top faces of the low-resistive regions 123 and 125 are covered with the resist pattern 325; recesses by over-etching are not formed. The low-resistive region 105 of the low-temperature polysilicon layer 108 is exposed to the etchant so that a natural oxide film 358 is generated.

Figure 8C:
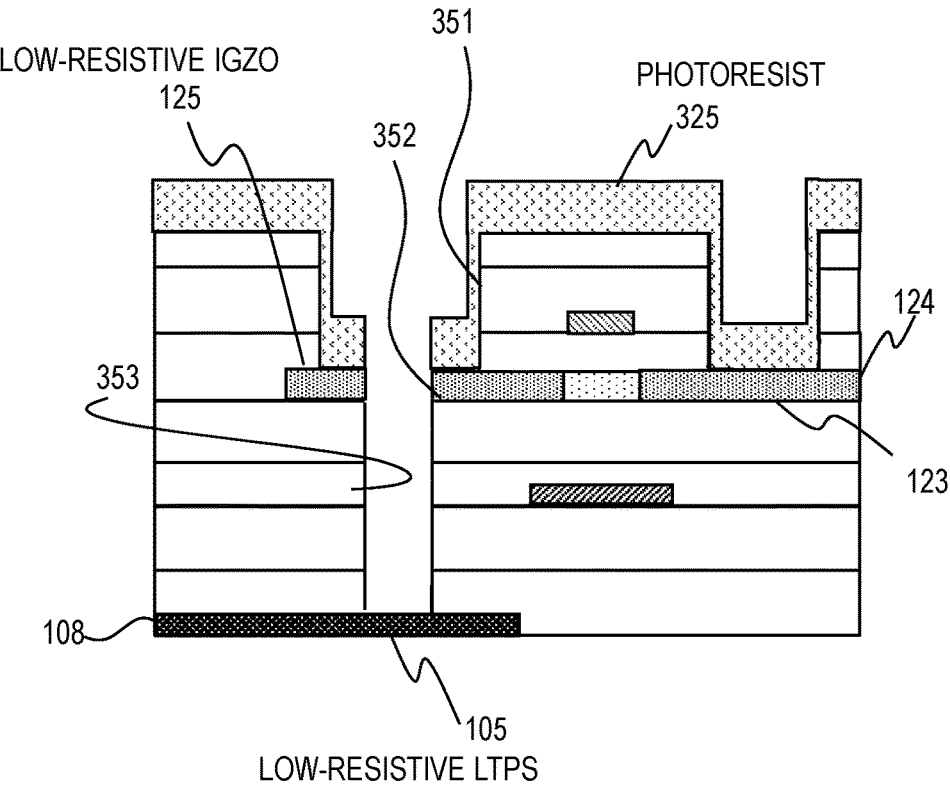
FIG. 8C illustrates a state where the natural oxide film of the low-temperature polysilicon layer is removed from the product in process in the state of FIG. 8B.

FIG. 8C illustrates a state where the natural oxide film 358 of the low-temperature polysilicon layer 108 is removed from the product in process in the state of FIG. 8B. The natural oxide film 358 can be removed by hydrofluoric acid (HF) in the state where the photoresist pattern 325 is remaining. The photoresist pattern 325 reduces the adverse effect of the hydrofluoric acid onto the oxide semiconductor layer 124.

Figure 8D:
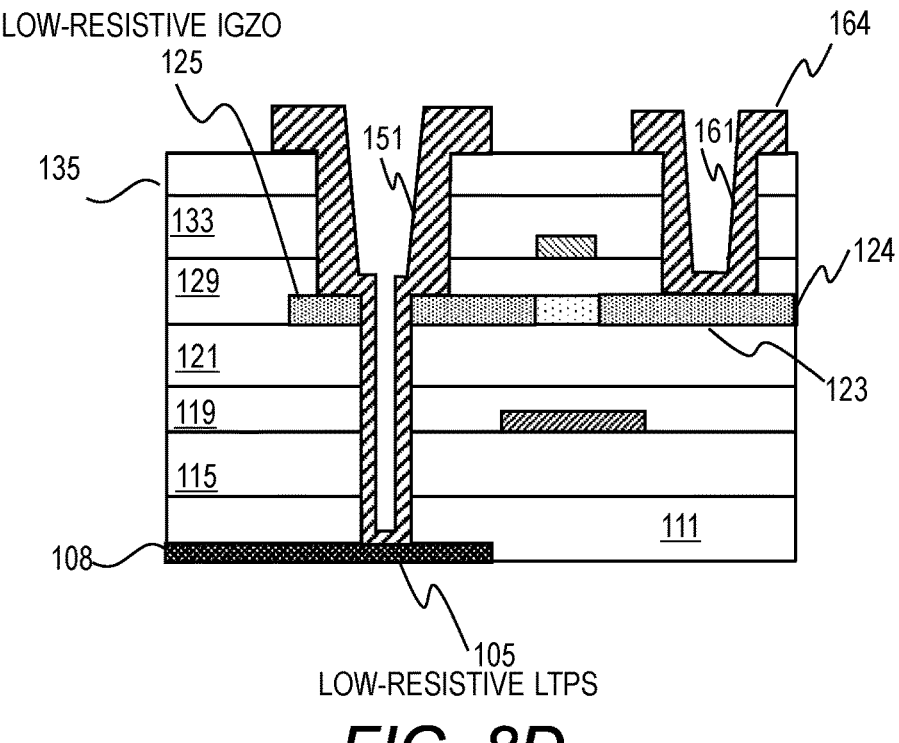
FIG. 8D illustrates a state where an M4 metal layer is provided on the product in process in the state of FIG. 8C.

FIG. 8D illustrates a state where the M4 metal layer is provided on the product in process in the state of FIG. 8C. The contact region 151 interconnects the low-resistive region 125 of the oxide semiconductor layer 124 and the low-resistive region 105 of the low-temperature polysilicon layer 108. The contact region 161 interconnects the source/drain line 164 and the low-resistive region 123 of the oxide semiconductor layer 124. The natural oxide film 358 has been removed by the process with hydrofluoric acid; the contact region 151 is in direct contact with the surface of the low-resistive region 105 of the polysilicon layer 108 having a lower resistance.

Hydrofluoric acid may slightly etch the silicon oxide layers, the silicon nitride layers, and the oxide semiconductor layer together with the natural oxide film 358. The etching rate for the oxide semiconductor layer is faster than the etching rates for the silicon oxide layers and the silicon nitride layers. For this reason, the oxide semiconductor layer may be partially etched in its end face together with the natural oxide film 358 to be recessed from the end face of the insulating layers.

Figure 9A:
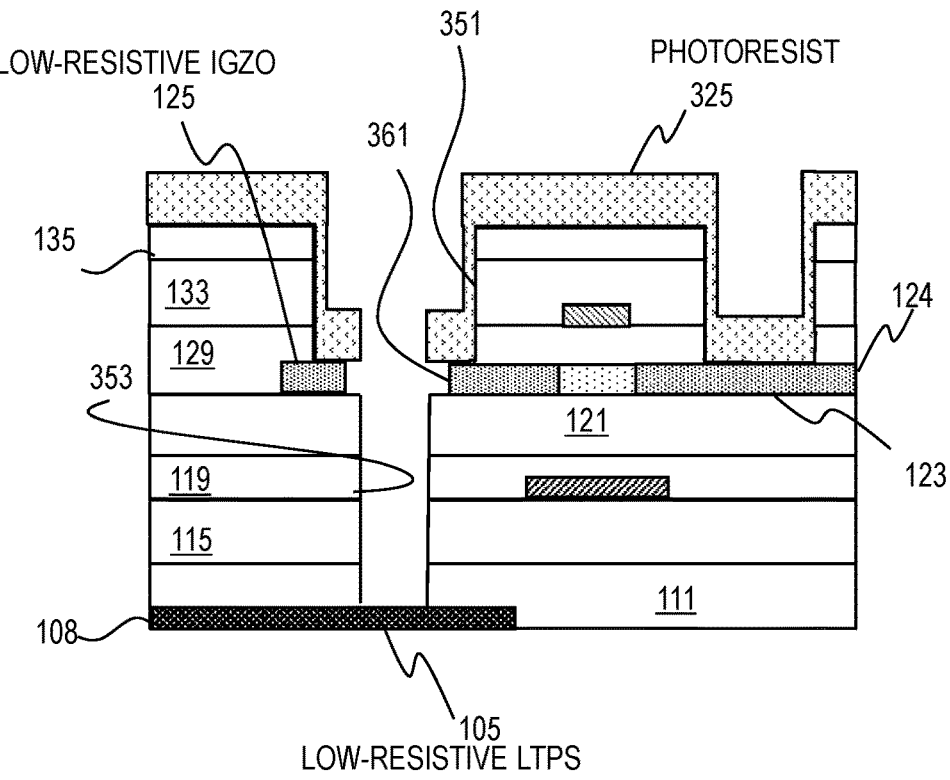
FIG. 9A schematically illustrates an oxide semiconductor layer whose end face defining a hole is recessed because of hydrofluoric acid.

FIG. 9A schematically illustrates the oxide semiconductor layer 124 whose end face defining the hole 352 is recessed because of hydrofluoric acid. FIG. 9A schematically illustrates a state where the oxide semiconductor layer 124 is partially removed from the product in process in the state of FIG. 8C. The end face 361 is recessed from the end face of the lower insulating layer 121 and is located on the top face of the insulating layer 121. The diameter of the hole in the low-resistive region 125 of the oxide semiconductor layer 124 is smaller than the diameter of the hole in the insulating layer 129 immediately thereabove and larger than the diameter of the hole in the insulating layer 121 immediately thereunder.

Figure 9B:
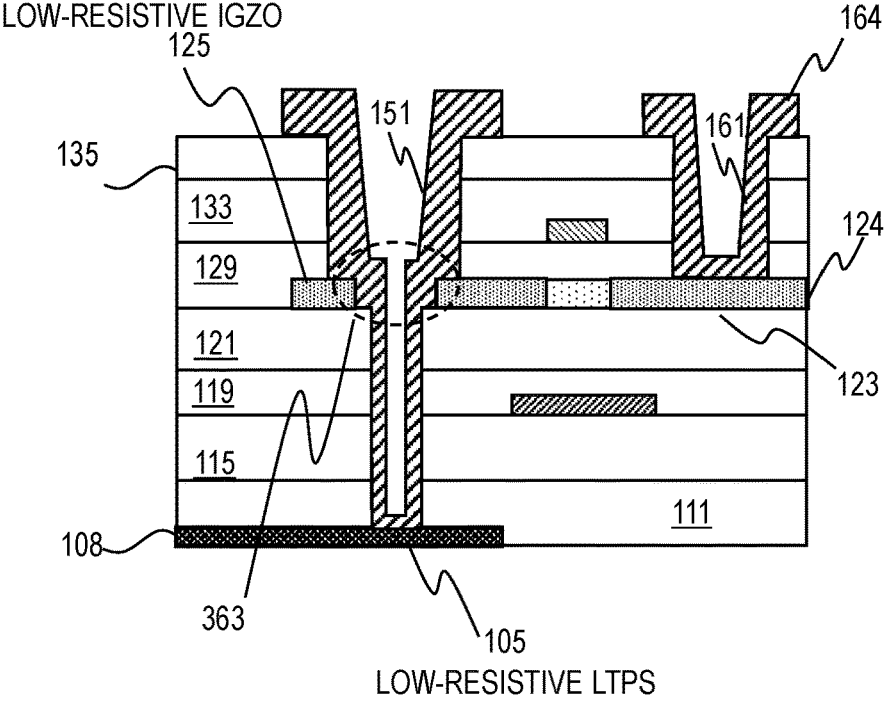
FIG. 9B illustrates a state where the photoresist is removed from the product in process in the state of FIG. 9A and an M4 metal layer pattern is provided.

FIG. 9B illustrates a state where the photoresist pattern 325 has been removed from the product in process in the state of FIG. 9A and the M4 metal layer (pattern) is provided. As illustrated in the area surrounded by the dashed line 363, the contact region 151 includes a region covering the top face of the insulating layer 121 projecting from the end (side) face of the low-resistive region 125. This region is thick and protects the end face of the low-resistive region 125 from being damaged by the subsequent processes.

Other Configuration Examples

Figure 10:
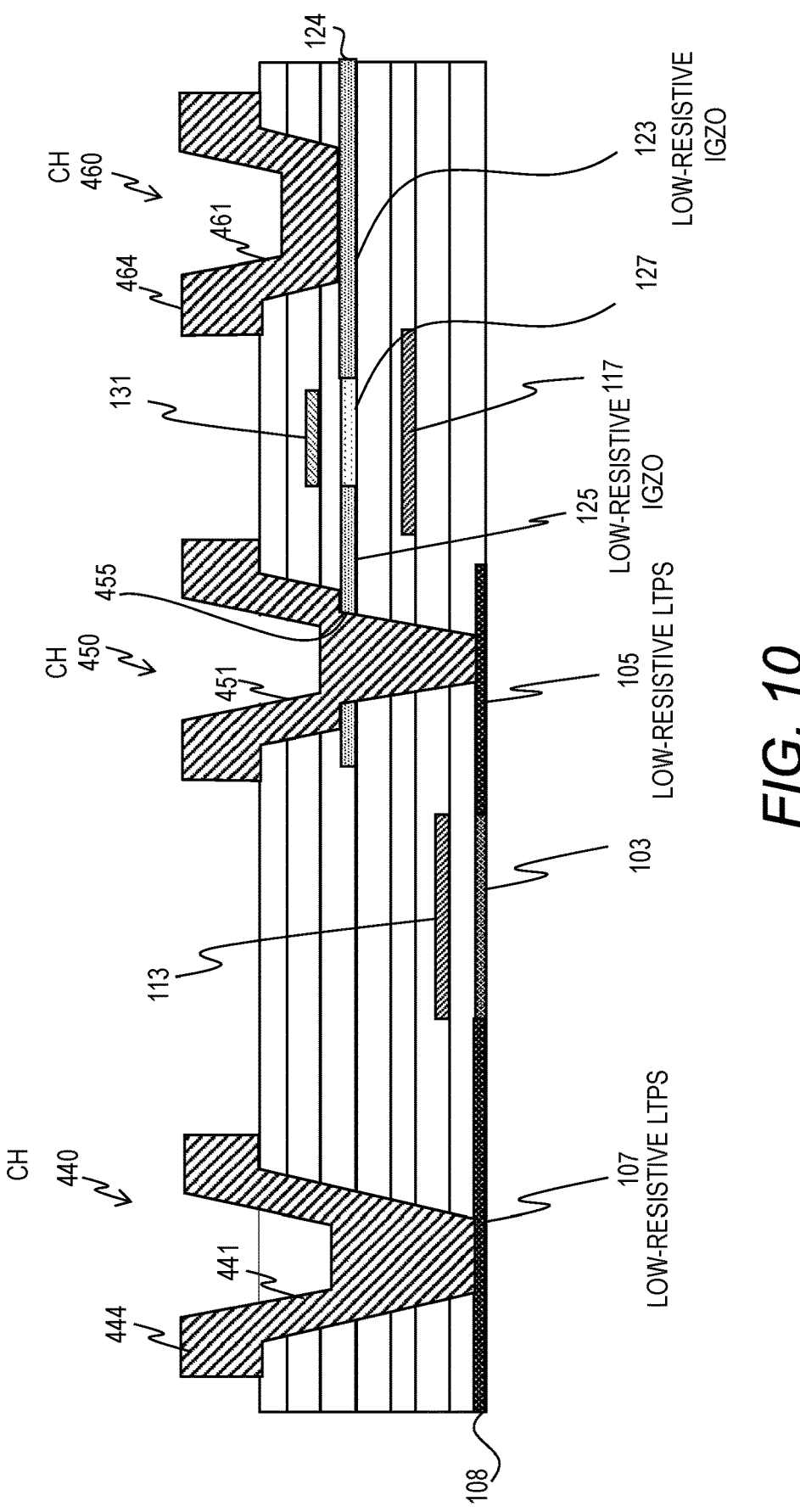
FIG. 10 illustrates another structural example of a contact hole.

FIG. 10 illustrates another structural example of a contact hole. FIG. 10 includes contact holes 440, 450, and 460 in place of the contact holes 140, 150, and 160 in FIG. 3. Some of the components and some of the reference signs are omitted in FIG. 10.

The contact holes 440, 450, and 460 include metal contact regions 441, 451, and 461, respectively. The contact region 441 interconnects a low-resistive region 107 of a low-temperature polysilicon layer 108 and a source/drain line 444. The contact region 451 interconnects a low-resistive region 125 of an oxide semiconductor layer 124 and a low-resistive region 105 of the low-temperature polysilicon layer 108. The contact region 461 interconnects a low-resistive region 123 of the oxide semiconductor layer 124 and a source/drain line 464.

The metal contact regions 441, 451, and 461 (the M4 metal layer) are thicker than the metal contact regions in the structural example in FIG. 3. In the example of FIG. 10, the hole 455 of the oxide semiconductor layer 124 and the hole of the stack of insulating layers lower than the oxide semiconductor layer 124 are filled with the metal contact region 451 (filling structure). Protecting the end (side) face of the oxide semiconductor layer 124 with thick metal reduces the damage to the end face of the oxide semiconductor layer in the subsequent processes.

Figure 11:
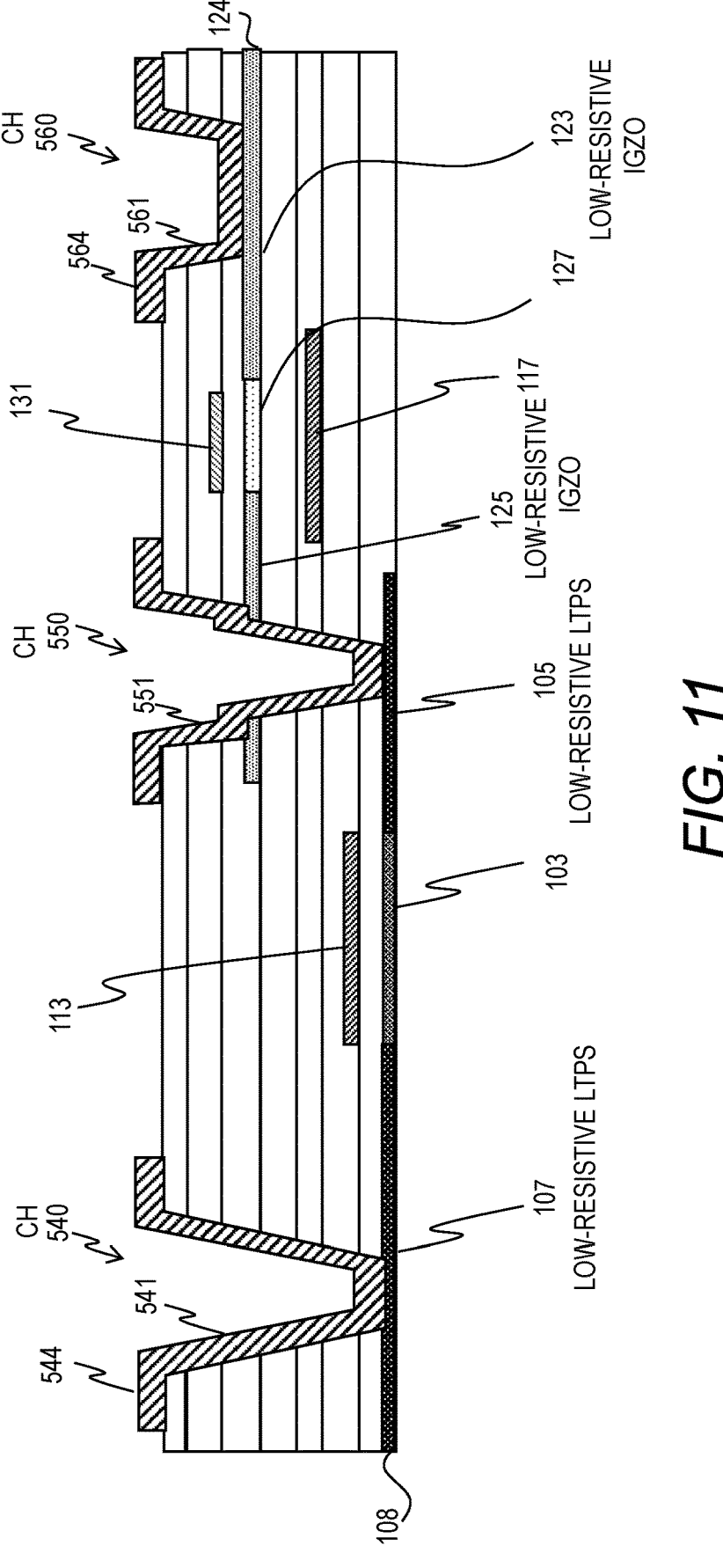
FIG. 11 illustrates still another structural example of a contact hole.

FIG. 11 illustrates still another example of a contact hole. FIG. 11 includes contact holes 540, 550, and 560 in place of the contact holes 140, 150, and 160 in FIG. 3. The other components are the same. Some of the components and some of the reference signs are omitted in FIG. 11.

The contact holes 540, 550, and 560 include metal contact regions 541, 551, and 561, respectively. The contact region 541 interconnects a low-resistive region 107 of a low-temperature polysilicon layer 108 and a source/drain line 544. The contact region 551 interconnects a low-resistive region 125 of an oxide semiconductor layer 124 and a low-resistive region 105 of the low-temperature polysilicon layer 108. The contact region 561 interconnects a low-resistive region 123 of the oxide semiconductor layer 124 and a source/drain line 564.

The contact regions 541, 551, and 561 are tapered. In other words, their outer diameters and inner diameters decrease from the top toward the bottom. Especially, the tapered contact region 551 effectively prevents discontinuity of the contact region 551 at the end face of the oxide semiconductor layer 124. This configuration reduces the damage to the end face of the oxide semiconductor layer in the subsequent processes.

Figure 12:
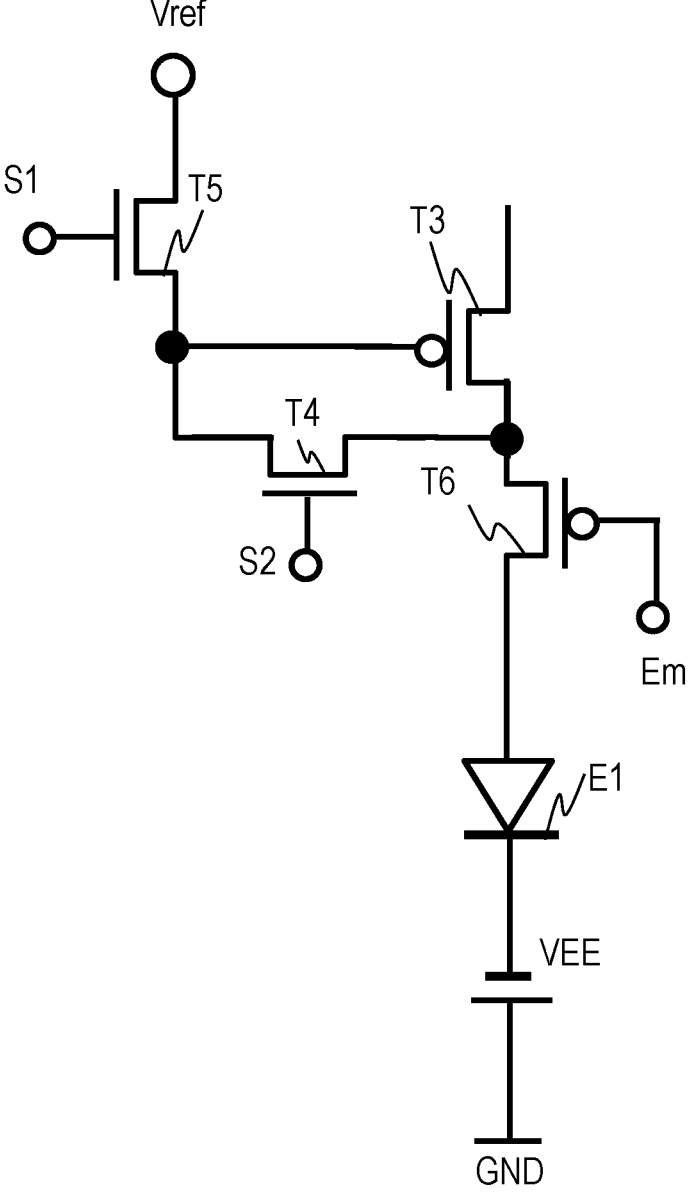
FIG. 12 illustrates an example of a part of a pixel circuit.

Hereinafter, examples of a pixel circuit and a device structure for the pixel circuit are described. FIG. 12 illustrates an example of a part of a pixel circuit. The pixel circuit includes transistors T3 to T6 and an OLED element E1. The transistor T3 is a driving transistor and the other transistors are switching transistors. The transistors T4 and T5 are n-type oxide semiconductor TFTs and the other transistors are p-type low-temperature polysilicon TFTs.

The transistor T4 is connected between the drain region and the gate electrode of the driving transistor T3. The transistor T5 is connected between the line for a reference potential Vref and the gate electrode of the driving transistor T3.

The transistor T6 is connected between the drain region of the driving transistor T3 and the anode electrode of the OLED element E1. The transistor T6 is controlled by a control signal Em; the transistor T4 is controlled by a control signal S2; and the transistor T5 is controlled by a control signal S1. The control signal S2 can be the S1 signal for the next pixel circuit row.

Figure 13:
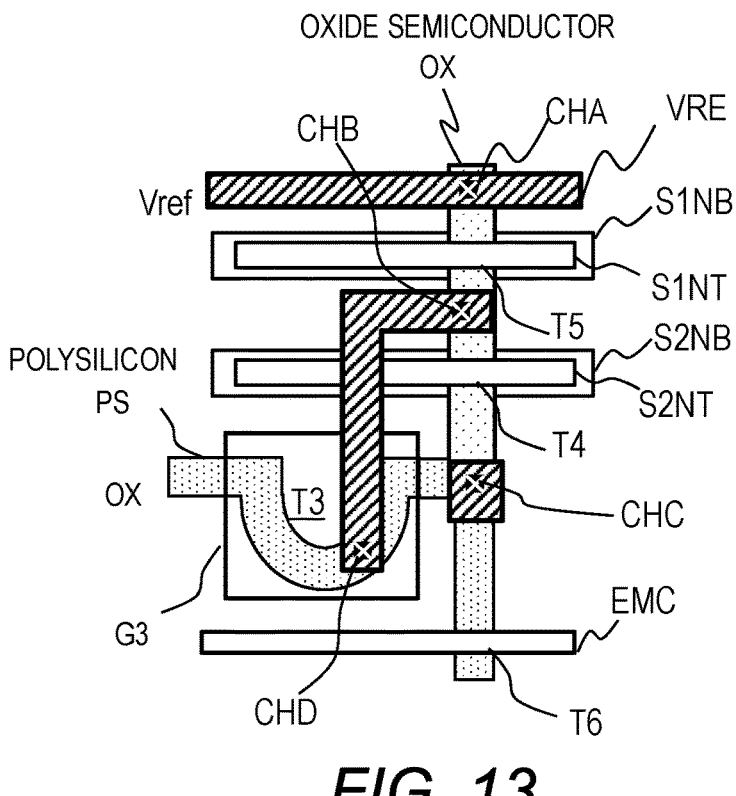
FIG. 13 schematically illustrates a planar structure of the pixel circuit illustrated in FIG. 12.
Figure 14:
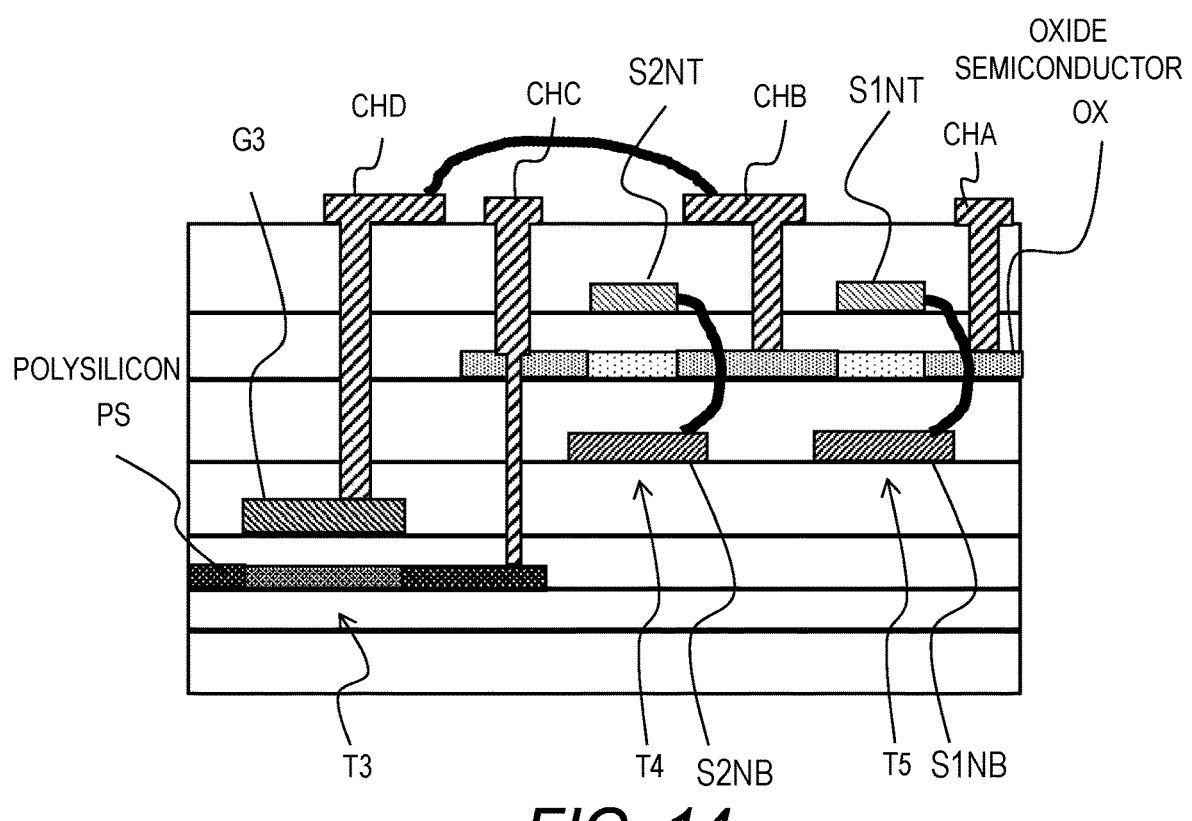
FIG. 14 schematically illustrates the cross-sectional structure of a part of the planar structure illustrated in FIG. 13.

FIG. 13 schematically illustrates a planar structure of the circuit illustrated in FIG. 12 and FIG. 14 schematically illustrates the cross-sectional structure of a part of the planar structure in FIG. 13. The layers in white in FIG. 14 represent insulating layers. The line VRE transmits the reference potential Vref. The line EMC transmits the control signal Em for the gate electrode of the transistor T6. The gate line S2NB transmits the gate signal for the bottom-gate electrode of the transistor T4 and the gate line S2NT transmits the gate signal for the top-gate electrode of the transistor T4. The gate line S1NB transmits the gate signal for the bottom-gate electrode of the transistor T5 and the gate line S1NT transmits the gate signal for the top-gate electrode of the transistor T5.

The contact hole CHC interconnects a source/drain region of the transistor T4 and a source/drain region of the transistor T3 or T6. The semiconductor layer of the transistor T4 is the oxide semiconductor layer OX and the semiconductor layers of the transistors T3 and T6 are the low-temperature polysilicon layer PS. The contact hole CHC interconnects the oxide semiconductor layer and the low-temperature polysilicon layer.

The contact hole CHB interconnects a source/drain region and a source/drain line of the transistor T4. The contact hole CHD interconnects the source/drain line and the gate electrode G3 of the transistor T3. The contact hole CHA interconnects a source/drain region of the transistor T5 and the line VRE.

Figure 15:
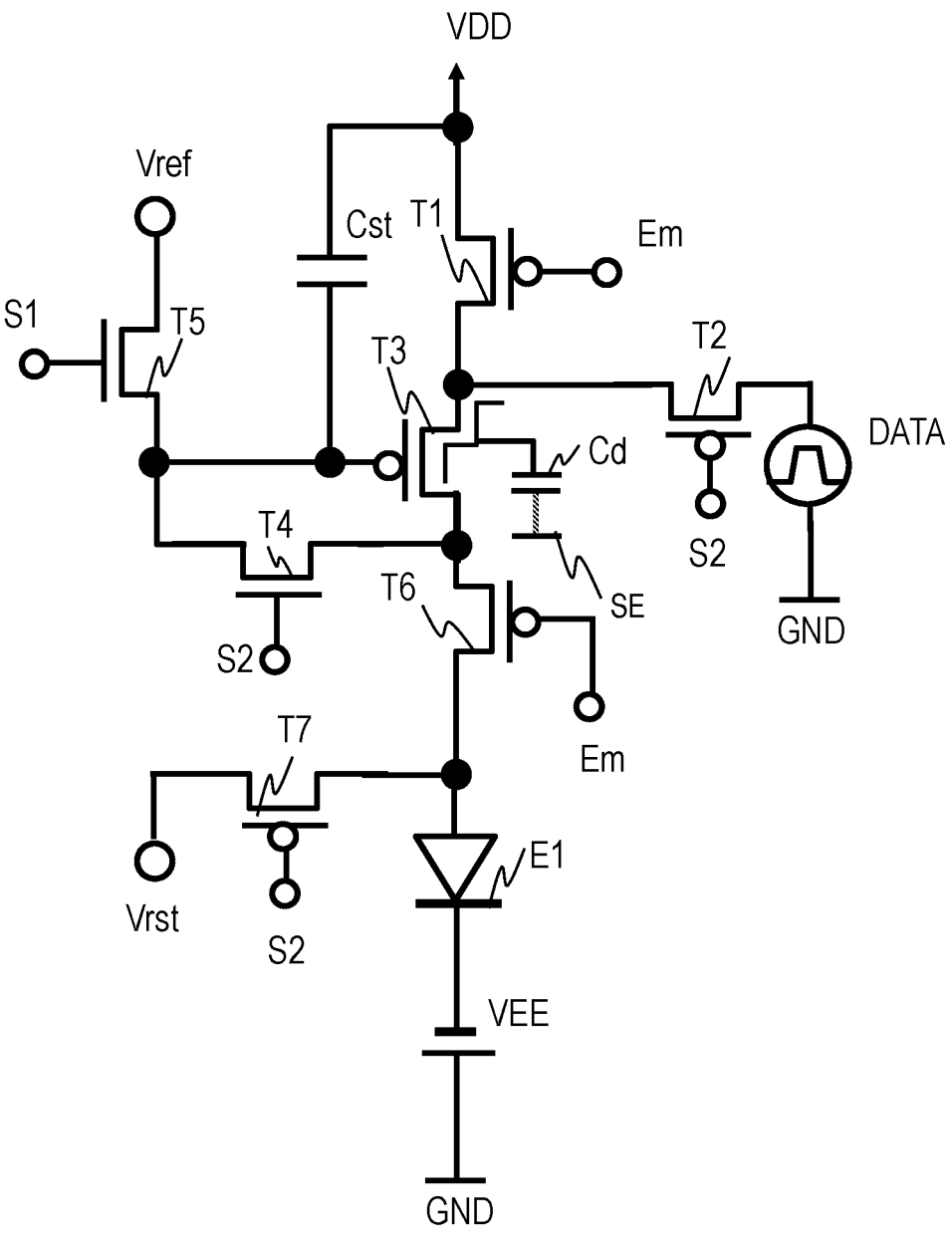
FIG. 15 illustrates an example of a pixel circuit.

Another example of a pixel circuit and an example of a device structure for the pixel circuit are described. FIG. 15 illustrates an example of a pixel circuit. The pixel circuit includes transistors T1 to T7, an OLED element E1, a storage capacitor Cst, and a capacitor Cd. The transistor T3 is a driving transistor and the other transistors are switching transistors. The transistors T4 and T5 are n-type oxide semiconductor TFTs and the other transistors are p-type low-temperature polysilicon TFTs.

The transistor T2 is connected between the source region of the driving transistor T3 and the data line for transmitting a data signal (DATA). The transistor T1 is connected between the source region of the driving transistor T3 and the line for transmitting a power supply potential VDD. The transistor T4 is connected between the drain region and the gate electrode of the driving transistor T3. The transistor T5 is connected between the line for a reference potential Vref and the gate electrode of the driving transistor T3.

The transistor T6 is connected between the drain region of the driving transistor T3 and the anode electrode of the OLED element E1. The transistor T7 is connected between the anode electrode of the OLED element E1 and the line for transmitting a reset potential Vrst. The storage capacitor Cst is connected between the transmission line for the power supply potential VDD and the gate electrode of the driving transistor T3. The capacitor Cd is connected between the transistor T3 and a shield electrode SE. The transistors T1 and T6 are controlled by a control signal Em; the transistors T2, T4, and T7 are controlled by a control signal S2; and the transistor T5 is controlled by a control signal S1.

Figure 16:
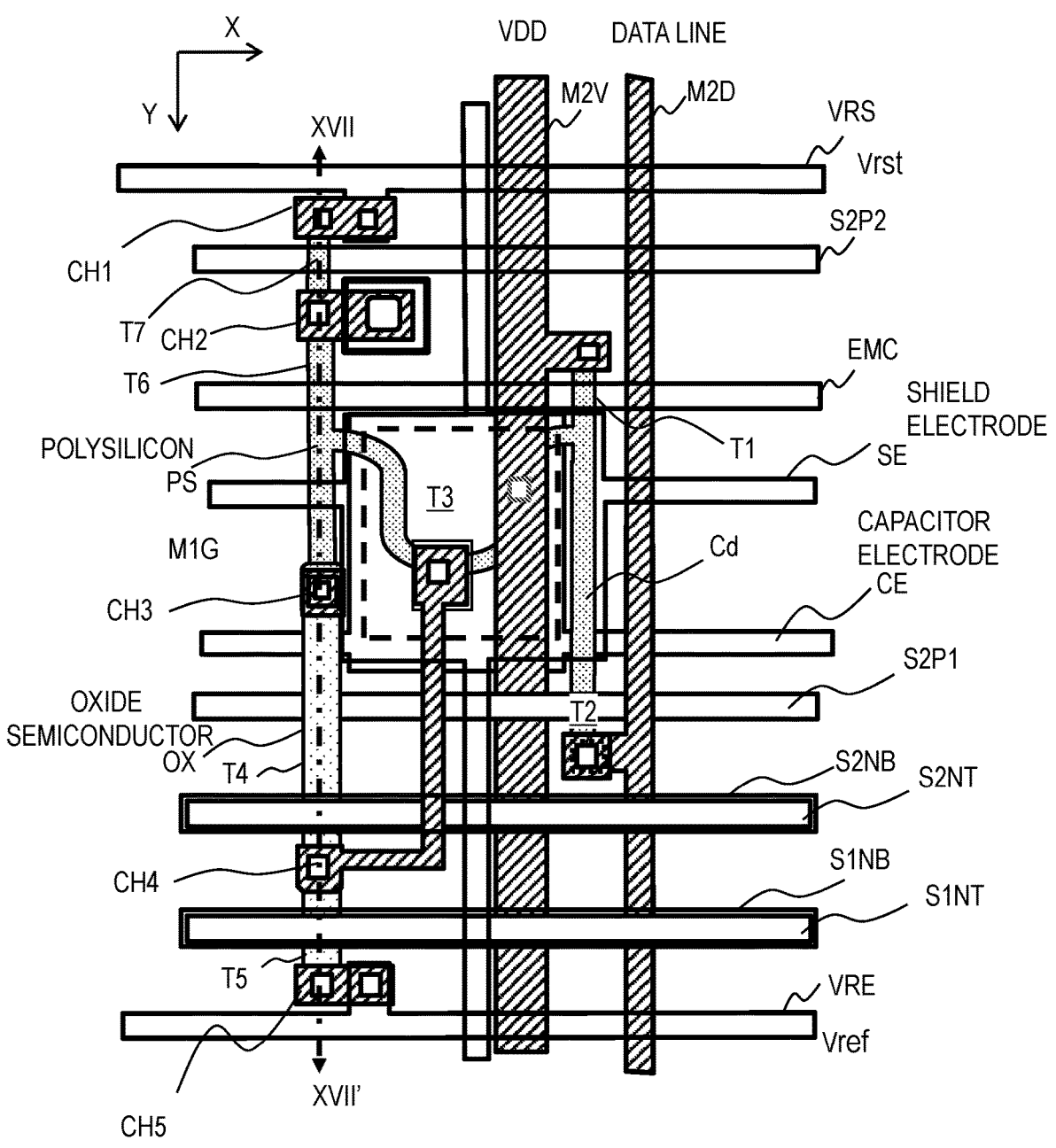
FIG. 16 schematically illustrates a planar structure of the pixel circuit illustrated in FIG. 15.
Figure 17:
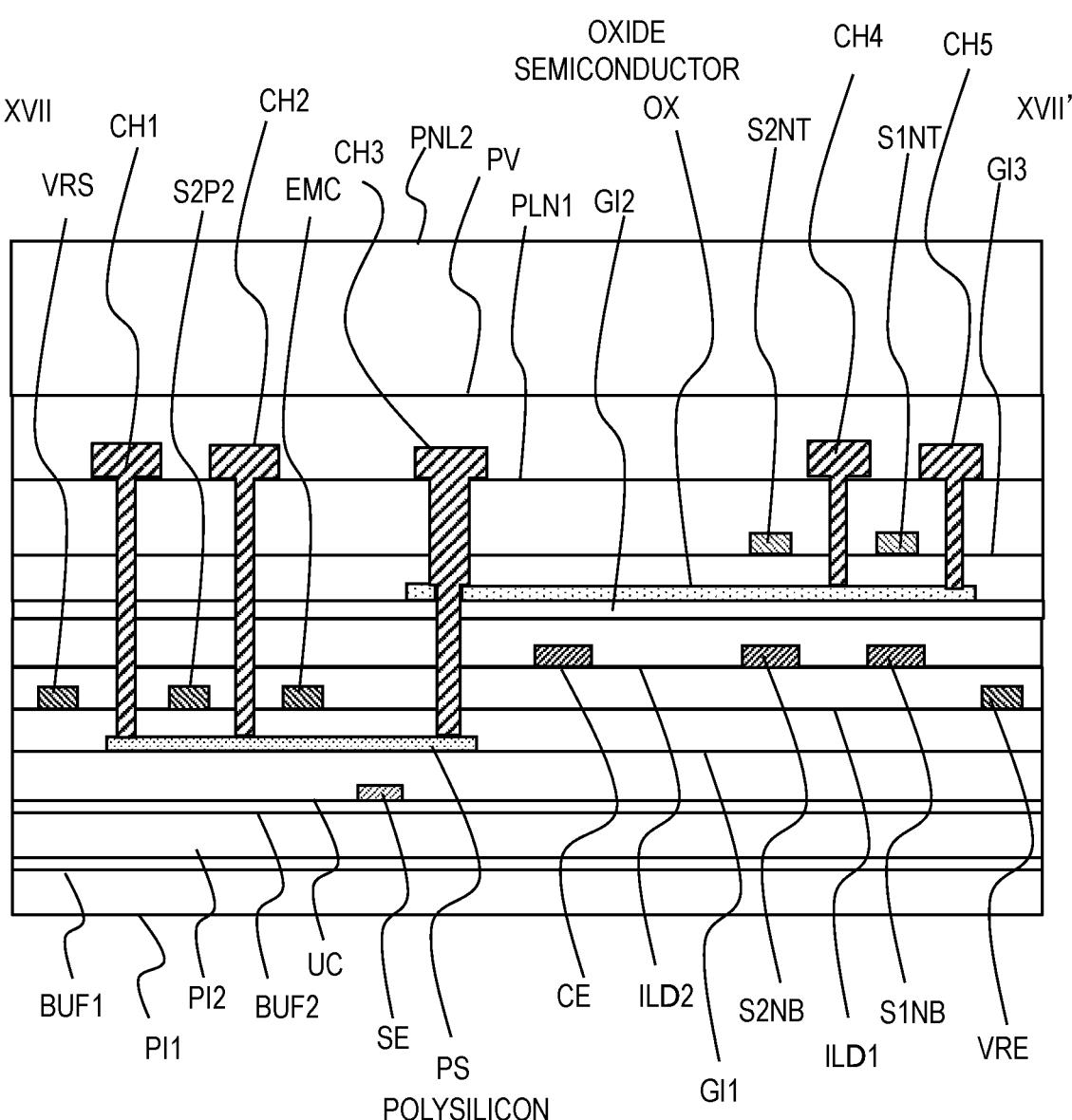
FIG. 17 schematically illustrates the cross-sectional structure along the section line XVII-XVII' in FIG. 16.

FIG. 16 schematically illustrates a planar structure of the pixel circuit illustrated in FIG. 15 and FIG. 17 schematically illustrates the cross-sectional structure along the section line XVII-XVII' in FIG. 16. In FIG. 16, the line M2D is the data line and the line M2V transmits the power supply potential VDD. The line VRS transmits the reset potential Vrst and the line VRE transmits the reference potential Vref.

The gate line S2P2 transmits the gate signal for the transistor T7. The line EMC transmits the control signal Em for the gate electrodes of the transistors T1 and T6. The shield electrode SE includes one of the electrodes of the capacitor Cd and the capacitor electrode CE includes one of the electrodes of the storage capacitor Cst.

The gate line S2P1 transmits the gate signal for the transistor T2. The gate line S2NB transmits the gate signal for the bottom-gate electrode of the transistor T4 and the gate line S2NT transmits the gate signal for the top-gate electrode of the transistor T4. The gate line S1NB transmits the gate signal for the bottom-gate electrode of the transistor T5 and the gate line S1NT transmits the gate signal for the top-gate electrode of the transistor T5.

The contact hole CH1 interconnects a source/drain region of the transistor T7 and the line VRS. The contact hole CH2 interconnects the other source/drain region of the transistor T7 and the anode electrode of the OLED element. The contact hole CH3 interconnects a source/drain region of the transistor T4 and a source/drain region of the transistor T3 or T6. The semiconductor layer of the transistor T4 is the oxide semiconductor layer OX and the semiconductor layers of the transistors T3 and T6 are the low-temperature polysilicon layer PS. The contact hole CH3 interconnects the oxide semiconductor layer and the low-temperature polysilicon layer.

The contact hole CH4 interconnects the other source/drain region of the transistor T4 and a source/drain line, which is connected to the gate electrode M1G of the transistor T3. The contact hole CH5 interconnects a source/drain region of the transistor T5 and the line VRE.

FIG. 17 schematically illustrates the cross-sectional structure along the section line XVII-XVII' in FIG. 16. The stack of a polyimide layer P11, a buffer layer BUF1, and another polyimide layer P12 corresponds to an insulating substrate. The shield electrode SE is laid above a buffer layer BUF2. An undercoat insulating layer UC is laid to cover the shield electrode SE.

The low-temperature polysilicon layer PS is laid above the undercoat insulating layer UC and a gate insulating layer GI1 is laid to cover the low-temperature polysilicon layer PS. The lines VRS, S2P2, EMC, and VRE are provided above the gate insulating layer GI1. These are included in the same metal layer pattern. An interlayer insulating layer ILD1 is laid to cover the lines VRS, S2P2, EMC, and VRE.

The capacitor electrode CE and the lines S2NB and S1NB are laid above the interlayer insulating layer ILD1. These are included in the same metal layer pattern. Another interlayer insulating layer ILD2 is laid to cover the capacitor electrode CE and the lines S2NB and S1NB. A gate insulating layer GI2 is laid above the interlayer insulating layer ILD2.

The oxide semiconductor layer OX is laid above the gate insulating layer GI2. Another gate insulating layer GI3 is laid to cover the oxide semiconductor layer OX. The lines S2NT and S1NT are laid above the gate insulating layer GI3. A planarization layer PLN1 is laid to cover the lines S2NT and S1NT.

The contact holes CH1 and CH2 extend through the insulating layers PLN1, GI3, GI2, ILD2, ILD1, and GI1 and are in contact with the low-temperature polysilicon layer (low-resistive regions thereof).

The contact hole CH3 extends through the insulating layers PLN1 and GI3 and is in contact with the top face of the oxide semiconductor layer OX. The contact hole CH3 further extends through the oxide semiconductor layer OX and is in contact with the end face of the oxide semiconductor layer OX defining the hole. The contact hole CH3 further extends through the insulating layers GI2, ILD2, ILD1, and GI1 and is in contact with the low-temperature polysilicon layer (a low-resistive region thereof).

The contact holes CH4 and CH5 extend through the insulating layers PLN1 and GI3 and are in contact with the top face of the oxide semiconductor layer OX. A passivation layer PV is laid to cover the contact holes CH1 to CH5 and further, a planarization layer PLN2 is laid above the passivation layer PV.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A thin-film transistor device comprising:
a first thin-film transistor including a first semiconductor layer on a substrate;
a second thin-film transistor including a second semiconductor layer on the substrate;
one or more upper insulating layers on the substrate;
one or more lower insulating layers on the substrate; and
a metal contact region in contact with the first semiconductor layer and the second semiconductor layer,
wherein the first semiconductor layer and the second semiconductor layer are made of different materials,
wherein the first semiconductor layer, the one or more lower insulating layers, the second semiconductor layer, and the one or more upper insulating layers are laid one above another in this order when viewed from the substrate,
wherein the first semiconductor layer includes a first channel region and first source/drain regions sandwiching the first channel region,
wherein the second semiconductor layer includes a second channel region and second source/drain regions sandwiching the second channel region,
wherein the metal contact region is located in a hole extending through the one or more upper insulating layers and the one or more lower insulating layers and in contact with one of the first source/drain regions and one of the second source/drain regions,
wherein a diameter of the hole at the lowermost layer in the one or more upper insulating layers is larger than a diameter of the hole at the uppermost layer in the one or more lower insulating layers,
wherein the metal contact region is made of the same metal material as source/drain lines of the first thin-film transistor and the second thin-film transistor,
wherein the one of the second source/drain regions overlaps at least a part of the one of the first source/drain regions when viewed in a layering direction,
wherein the hole extends through the one of the second source/drain regions, and
wherein the metal contact region is in contact with an end face defining the hole and a top face of the one of the second source/drain regions and a top face of the one of the first source/drain regions.

2. The thin-film transistor device according to claim 1,
wherein one of the first semiconductor layer and the second semiconductor layer is a low-temperature polysilicon layer, and
wherein the other one of the first semiconductor layer and the second semiconductor layer is an oxide semiconductor layer.

3. The thin-film transistor device according to claim 1,
wherein the hole in the one or more upper insulating layers is located inner than a perimeter of the one of the second source/drain regions when viewed in the layering direction, and
wherein the hole in the one or more lower insulating layers is located inner than a perimeter of the one of the first source/drain regions when viewed in the layering direction.

4. The thin-film transistor device according to claim 1, wherein the end face defining the hole of the one of the second source/drain regions is recessed from an end face of a lower insulating layer immediately under the second semiconductor layer.

5. The thin-film transistor device according to claim 1, wherein a part of the one of the second source/drain regions located inside the hole is thinner than a part of the one of the second source/drain regions located outside the hole.

6. The thin-film transistor device according to claim 1, wherein the metal contact region has a tapered shape.

7. The thin-film transistor device according to claim 1, wherein the hole is filled with the metal contact region at least in a part lower than a top face of the second semiconductor layer.

8. A method of manufacturing a thin-film transistor device, comprising:
producing a first semiconductor layer;
producing one or more lower insulating layers above the first semiconductor layer;
producing a second semiconductor layer of a material different from a material of the first semiconductor layer above the uppermost layer of the one or more lower insulating layers;
producing one or more upper insulating layers above the second semiconductor layer;
opening a hole extending through the one or more upper insulating layers and the one or more lower insulating layers to expose a part of a source/drain region of the first semiconductor layer and a part of a source/drain region of the second semiconductor layer within the hole; and
producing a metal pattern including source/drain lines and a metal contact region to be in contact with the part of the first semiconductor layer and the part of the second semiconductor layer within the hole,
wherein the producing the second semiconductor layer includes opening a hole in a source/drain region of the second semiconductor layer, and
wherein the opening a hole extending through the one or more upper insulating layers and the one or more lower insulating layers includes:
exposing the hole in the second semiconductor layer and a peripheral region around the hole of the second semiconductor layer; and
over-etching the peripheral region.

9. A method of manufacturing a thin-film transistor device, comprising:
producing a first semiconductor layer;
producing one or more lower insulating layers above the first semiconductor layer;
producing a second semiconductor layer of a material different from a material of the first semiconductor layer above the uppermost layer of the one or more lower insulating layers;
producing one or more upper insulating layers above the second semiconductor layer;
opening a hole extending through the one or more upper insulating layers and the one or more lower insulating layers to expose a part of a source/drain region of the first semiconductor layer and a part of a source/drain region of the second semiconductor layer within the hole; and producing a metal pattern including source/drain lines and a metal contact region to be in contact with the part of the first semiconductor layer and the part of the second semiconductor layer within the hole, wherein the producing the second semiconductor layer includes opening a hole in a source/drain region of the second semiconductor layer, and wherein the opening a hole extending through the one or more upper insulating layers and the one or more lower insulating layers includes:

opening a hole extending through the one or more upper insulating layers by etching the one or more upper insulating layers using a first photoresist pattern as a mask to expose the hole in the second semiconductor layer and a peripheral region around the hole of the second semiconductor layer;

removing the first photoresist pattern and depositing a second photoresist pattern to cover the peripheral region;

opening a hole extending through the one or more lower insulating layers by etching the one or more lower insulating layers using the second photoresist pattern as a mask; and removing an oxide of the first semiconductor layer exposed within the hole extending through the one or more lower insulating layers.

10. A thin-film transistor device comprising:

a first thin-film transistor including a first semiconductor layer on a substrate;

a second thin-film transistor including a second semiconductor layer on the substrate;

one or more upper insulating layers on the substrate;

one or more lower insulating layers on the substrate; and a metal contact region in contact with the first semiconductor layer and the second semiconductor layer, wherein the first semiconductor layer and the second semiconductor layer are made of different materials, wherein the first semiconductor layer, the one or more lower insulating layers, the second semiconductor layer, and the one or more upper insulating layers are laid one above another in this order when viewed from the substrate, wherein the first semiconductor layer includes a first channel region and first source/drain regions sandwiching the first channel region, wherein the second semiconductor layer includes a second channel region and second source/drain regions sandwiching the second channel region, wherein the metal contact region is located in a hole extending through the one or more upper insulating layers and the one or more lower insulating layers and in contact with one of the first source/drain regions and one of the second source/drain regions, wherein a diameter of the hole at the lowermost layer in the one or more upper insulating layers is larger than a diameter of the hole at the uppermost layer in the one or more lower insulating layers, wherein the metal contact region is made of the same metal material as source/drain lines of the first thin-film transistor and the second thin-film transistor, wherein a part of the one of the second source/drain regions located inside the hole is thinner than a part of the one of the second source/drain regions located outside the hole.

11. The thin-film transistor device according to claim 10, wherein one of the first semiconductor layer and the second semiconductor layer is a low-temperature poly-silicon layer, and wherein the other one of the first semiconductor layer and the second semiconductor layer is an oxide semiconductor layer.

* * * * *